United States Patent
Afzalian et al.

(10) Patent No.: US 10,541,303 B2
(45) Date of Patent: Jan. 21, 2020

(54) NANOWIRE FINFET TRANSISTOR

(71) Applicant: Taiwan Semiconductor Manufacturing Company, Ltd., Hsinchu (TW)

(72) Inventors: Aryan Afzalian, Chastre (BE); Blandine Duriez, Brussels (BE); Mark van Dal, Linden (BE)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/996,110

(22) Filed: Jun. 1, 2018

(65) Prior Publication Data

US 2018/0277627 A1    Sep. 27, 2018

Related U.S. Application Data

(62) Division of application No. 15/608,052, filed on May 30, 2017, now Pat. No. 10,008,567, which is a
(Continued)

(51) Int. Cl.
*H01L 29/06* (2006.01)
*H01L 29/78* (2006.01)
(Continued)

(52) U.S. Cl.
CPC ...... *H01L 29/0676* (2013.01); *H01L 29/0673* (2013.01); *H01L 29/0847* (2013.01);
(Continued)

(58) Field of Classification Search
CPC ............. H01L 29/0676; H01L 29/0673; H01L 29/0847; H01L 29/1033; H01L 29/1037;
(Continued)

(56) References Cited

U.S. PATENT DOCUMENTS

| 6,872,647 B1 | 3/2005 | Yu et al. |
| 8,637,849 B2 | 1/2014 | Deligianni et al. |
(Continued)

FOREIGN PATENT DOCUMENTS

| CN | 103238208 A | 8/2013 |
| CN | 104011849 A | 8/2014 |
| KR | 20140103602 A | 8/2014 |

OTHER PUBLICATIONS

Kuhn, K.J., "Considerations for Ultimate CMOS Scaling," IEEE Transactions on Electron Devices, vol. 59, No. 7, Jul. 2012, pp. 1813-1828.

*Primary Examiner* — Shahed Ahmed
(74) *Attorney, Agent, or Firm* — Slater Matsil, LLP

(57) ABSTRACT

Semiconductor devices and methods of forming the same are provided. A semiconductor device includes a substrate having a fin. A first nanowire is disposed on the fin and a second nanowire is disposed on the fin, the second nanowire being laterally separated from the first nanowire. A gate structure extends around the first nanowire and the second nanowire. The gate structure also extends over a top surface of the fin. The first nanowire, the second nanowire, and the fin form a channel of a transistor.

20 Claims, 43 Drawing Sheets

Related U.S. Application Data division of application No. 15/096,099, filed on Apr. 11, 2016, now Pat. No. 9,679,968, which is a division of application No. 14/675,333, filed on Mar. 31, 2015, now Pat. No. 9,349,860.

(51) Int. Cl.
| | | |
|---|---|---|
| *H01L 29/08* | (2006.01) | |
| *H01L 29/10* | (2006.01) | |
| *H01L 29/66* | (2006.01) | |
| *H01L 29/786* | (2006.01) | |
| *H01L 29/423* | (2006.01) | |

(52) U.S. Cl.
CPC ...... *H01L 29/1033* (2013.01); *H01L 29/1037* (2013.01); *H01L 29/42356* (2013.01); *H01L 29/42392* (2013.01); *H01L 29/66666* (2013.01); *H01L 29/66742* (2013.01); *H01L 29/66787* (2013.01); *H01L 29/785* (2013.01); *H01L 29/7827* (2013.01); *H01L 29/7853* (2013.01); *H01L 29/78642* (2013.01); *H01L 29/78681* (2013.01); *H01L 29/78684* (2013.01); *H01L 29/78696* (2013.01)

(58) Field of Classification Search
CPC ......... H01L 29/42356; H01L 29/42392; H01L 29/66666; H01L 29/66742; H01L 29/66787; H01L 29/7827; H01L 29/785; H01L 29/78642; H01L 29/78681; H01L 29/78684; H01L 29/78696; H01L 29/0669–068; H01L 29/7853–7858
See application file for complete search history.

(56) References Cited

U.S. PATENT DOCUMENTS

| | | |
|---|---|---|
| 8,753,942 B2 | 6/2014 | Kuhn et al. |
| 2008/0061351 A1 | 3/2008 | Jang et al. |
| 2008/0237575 A1 | 10/2008 | Jin et al. |
| 2008/0237886 A1 | 10/2008 | Wu et al. |
| 2009/0035908 A1 | 2/2009 | Pribat et al. |
| 2009/0200540 A1 | 8/2009 | Bjoerk et al. |
| 2009/0294757 A1 | 12/2009 | Wernersson et al. |
| 2010/0176459 A1 | 7/2010 | Wernersson et al. |
| 2011/0140086 A1 | 6/2011 | Samuelson et al. |
| 2012/0037994 A1 | 2/2012 | Saitoh et al. |
| 2013/0153993 A1* | 6/2013 | Chang ................... B82Y 10/00 257/330 |
| 2013/0234215 A1 | 9/2013 | Okano |
| 2013/0313525 A1 | 11/2013 | Rosaz et al. |
| 2013/0337567 A1 | 12/2013 | Shin et al. |
| 2013/0341704 A1* | 12/2013 | Rachmady ........ H01L 29/66545 257/327 |
| 2014/0175515 A1* | 6/2014 | Then ..................... H01L 29/772 257/194 |
| 2014/0197377 A1 | 7/2014 | Kim et al. |
| 2014/0285980 A1* | 9/2014 | Cappellani .............. H01L 21/76 361/748 |
| 2015/0333122 A1 | 11/2015 | Chan et al. |
| 2016/0049489 A1 | 2/2016 | Wan et al. |
| 2016/0268376 A1 | 9/2016 | Shih |
| 2017/0309629 A1* | 10/2017 | Ching ............... H01L 29/66439 |

\* cited by examiner

NANOWIRE FINFET TRANSISTOR

PRIORITY CLAIM AND CROSS-REFERENCE

This application is a divisional of U.S. application Ser. No. 15/608,052, filed on May 30, 2017, entitled "Nanowire FinFET Transistor," which application is a divisional of U.S. application Ser. No. 15/096,099, filed on Apr. 11, 2016, entitled "Field Effect Transistors and Methods of Forming Same," now U.S. Pat. No. 9,679,968, issued on Jun. 13, 2017, which application is a divisional of U.S. application Ser. No. 14/675,333, filed on Mar. 31, 2015, entitled "Field Effect Transistors and Methods of Forming Same," now U.S. Pat. No. 9,349,860, issued on May 24, 2016, which applications are hereby incorporated herein by reference in their entirety.

BACKGROUND

Transistors are key components of modern integrated circuits. To satisfy the requirements of increasingly faster switching speed, the drive currents of transistors need to be increasingly higher. At the same time, the gate lengths of transistors are constantly being scaled down. Scaling down the gate lengths leads to undesirable effects known as "short-channel effects," with which the control of current flow by the gates is compromised. Among the short-channel effects are the drain-induced barrier lowering (DIBL) and the degradation of sub-threshold slope, both of which result in the degradation in the performance of transistors.

The use of multi-gate transistor architecture may help the relief of short-channel effects by improving electrostatic control of the gate on the channel. Fin field-effect transistors (FinFET) were thus developed. To further increase the control of the channels, and to reduce the short-channel effects, transistors having gate-all-around (GAA) structures were also developed, wherein the respective transistors are also referred to as gate all around transistors. In a gate all around transistor, a gate dielectric and a gate electrode fully encircle the channel region. This configuration delivers a good control of the channel, and the short-channel effects are reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
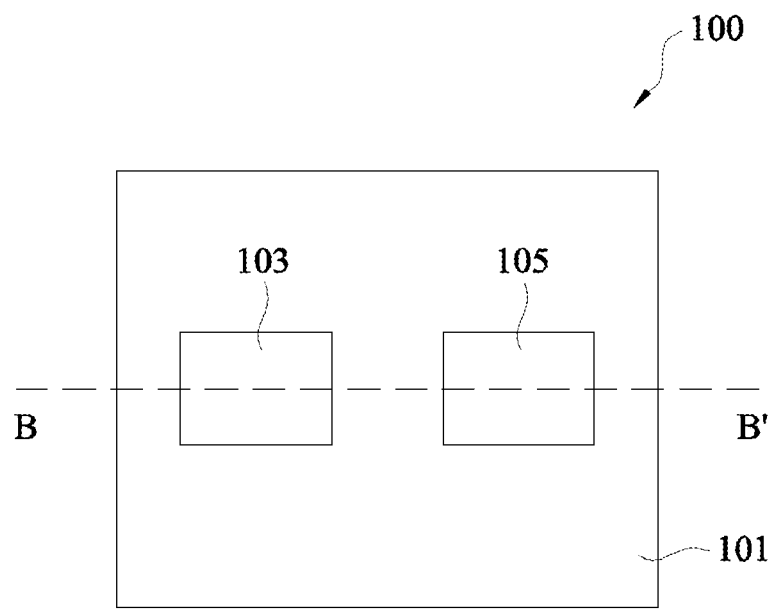
FIGS. 1A-13B illustrate various top and cross-sectional views of a fabrication process of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field effect transistors (FETs) and methods of forming the same are provided in accordance with various exemplary embodiments. The intermediate stages of forming the FETs are illustrated. Variations of the embodiments are discussed. Throughout the various views and illustrative embodiments, like reference numbers are used to designate like elements.

Embodiments such as those described herein provide FETs with one or more channels formed of vertical and horizontal nanowires. Hence, the channels have vertical and horizontal portions. The use of the nanowires allows for forming FETs in a gate-all-around (GAA) configuration, where gate stacks wrap around the channels for improved gate control. Such FETs may be also referred to as GAA FETs. Furthermore, the use vertical and horizontal nanowires allows for formation of FETs having different gate lengths that are defined by a single patterning step.

FIGS. 1A-13B illustrate various intermediate stages of fabrication of a semiconductor device 100 in accordance with some embodiments. FIGS. 1A-13B illustrate top and cross-sectional views, wherein an "A" figure represents a top view and a "B" figure represents a cross-sectional view along the B-B' line of the respective "A" figure.

Figure 1B:
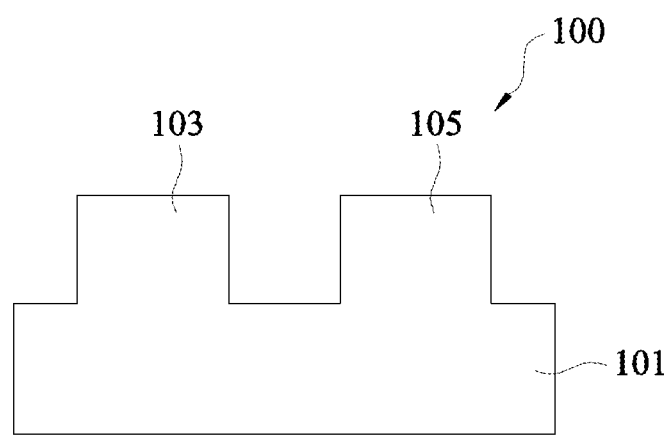

Referring first to FIGS. 1A and 1B, a portion of a substrate 101 having a first feature 103 and a second feature 105 formed thereon is illustrated. The substrate 101 may be formed of silicon, although it may also be formed of other group III, group IV, and/or group V elements, such as germanium, gallium, arsenic, and combinations thereof. The substrate 101 may also be in the form of silicon-on-insulator (SOI). Generally, an SOI substrate comprises a layer of a semiconductor material (e.g., silicon, germanium and/or the like) formed on an insulator layer. The insulator layer may be, for example, a buried oxide (BOX) layer or a silicon oxide layer. In addition, other substrates that may be used include multi-layered substrates, gradient substrates, hybrid orientation substrates, any combinations thereof and/or the like. As described below in greater detail, in some embodiments, portions of the substrate 101 are implanted with p-type impurities (such as boron or indium) or n-type impurities (such as phosphorous, arsenic, or antimony). The implanted regions have reduced resistivity, and hence may act as source/drain regions for subsequently formed devices, such as, for example, FETs.

In some embodiments, the substrate 101 is patterned to form the first feature 103 and the second feature 105. The substrate 101 may be patterned using suitable lithography and etch techniques. In some embodiments, a photoresist material (not shown) is formed over the substrate 101, which is then masked, exposed, and developed. After the photoresist material is patterned, an etch processes may be performed to remove unwanted portions of the underlying substrate 101. Additional masks (not shown), for example, hard masks, may be utilized during the etch process. Subsequently, the photoresist material may be removed using, for example, an ashing process combined with a wet clean process. In an embodiment where the substrate 101 comprises silicon, the substrate 101 may be anisotropically etched using, for example, a dry plasma etch with etchant gases such as $Cl_2$, HBr, $CF_4$, $SF_6$, $NF_3$, and the like. As described below in greater detail, the first feature 103 and the second feature 105 are doped using suitable dopants and act as a first source/drain feature 103 and a second source/drain feature 105, respectively, for the semiconductor device 100.

Referring further to FIGS. 1A and 1B, in the illustrated embodiment, the first feature 103 and the second feature 105 are formed by patterning the substrate 101 and, accordingly, comprise a same material as the substrate 101. In other embodiments, the first feature 103 and the second feature 105 may be formed on the substrate using, for example, an epitaxial growth process. In such embodiments, the first feature 103 and the second feature 105 may comprise a material that is different from the substrate 101.

Figure 2A:
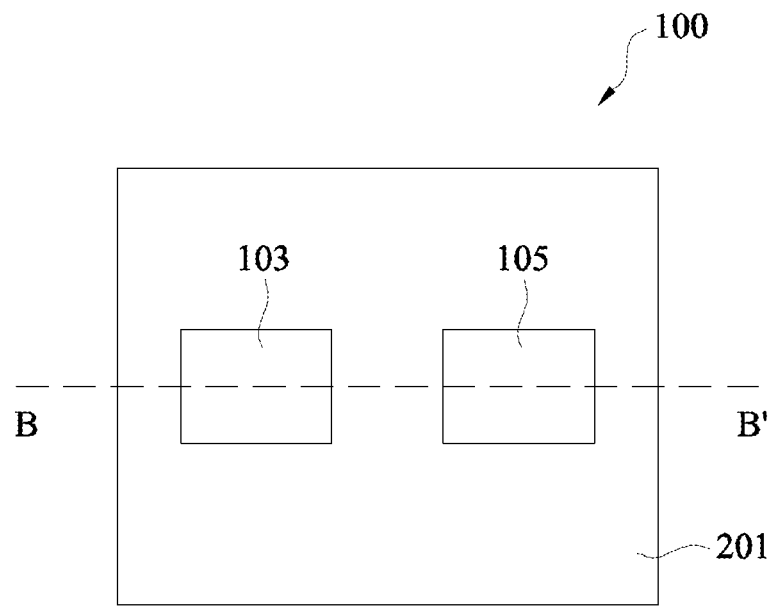
Figure 2B:
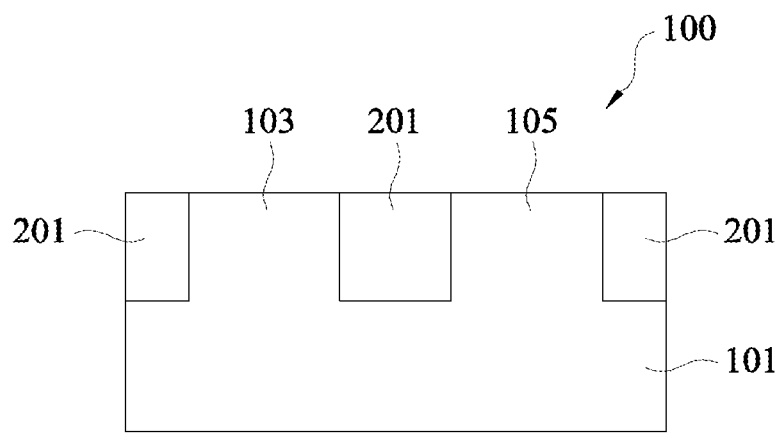

Referring to FIGS. 2A and 2B, a shallow trench isolation (STI) structure 201 is formed over the substrate 101 and surrounding the first feature 103 and the second feature 105. In some embodiments, the STI structure 201 may comprise a dielectric material such as, for example, silicon oxide, silicon nitride, silicon oxynitride, fluoride-doped silicate glass (FSG), low-k dielectrics such as carbon doped oxides, extremely low-k dielectrics such as porous carbon doped silicon oxide, a polymer such as polyimide, combinations of these, or the like. In some embodiments, the STI structure 201 may be formed using, for example, chemical vapor deposition (CVD), a spin-on process, a thermal oxidation process, although any other acceptable process may be also utilized. In some embodiments, a dielectric material of the STI structure 201 is formed over the substrate 101. Subsequently, portions of the dielectric material extending over top surfaces of the first feature 103 and the second feature 105 are removed to expose the top surfaces of the first feature 103 and the second feature 105 such that the top surfaces of the first feature 103 and the second feature 105 are substantially coplanar with a top surface of the STI structure 201. In some embodiments, excess portions of the dielectric material may be removed using, for example, an etch process, a grinding process, a chemical mechanical polishing (CMP) process, and the like.

In some embodiments, the first feature 103 and the second feature 105 are doped to form the first source/drain feature 103 and the second source/drain feature 105, respectively, of the semiconductor device 100. In some embodiments wherein the semiconductor device 100 is an n-type FET (NFET) and the substrate 101 comprises silicon, the first feature 103 and the second feature 105 may be n-doped using, for example, phosphorus (P), or arsenic (As). In some embodiments wherein the semiconductor device 100 is a p-type FET (PFET) and the substrate 101 comprises silicon, the first feature 103 and the second feature 105 may be p-doped using, for example, boron (B). In some embodiments, the first feature 103 and the second feature 105 may be doped using an ion implantation method, or the like. In some embodiments wherein the first feature 103 and the second feature 105 are formed of an epitaxially grown material, the first feature 103 and the second feature 105 may be in situ doped during the epitaxial growth process.

Figure 3A:
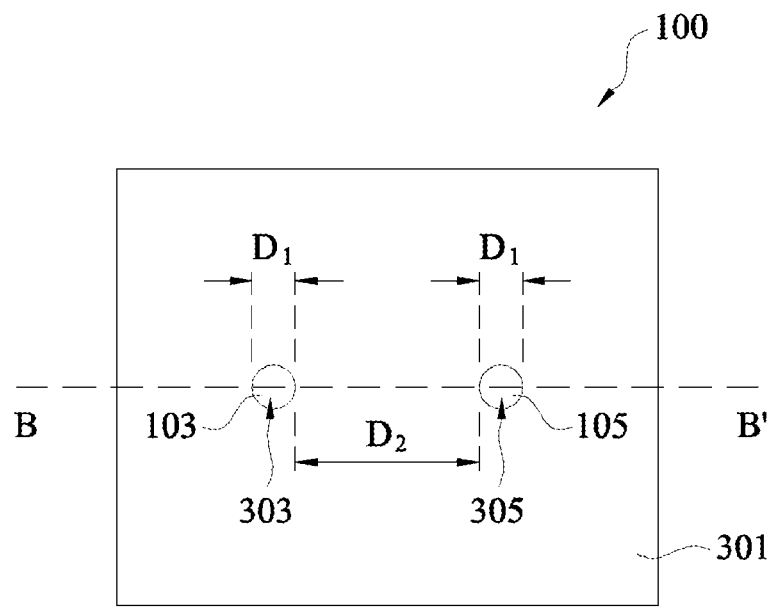
Figure 3B:
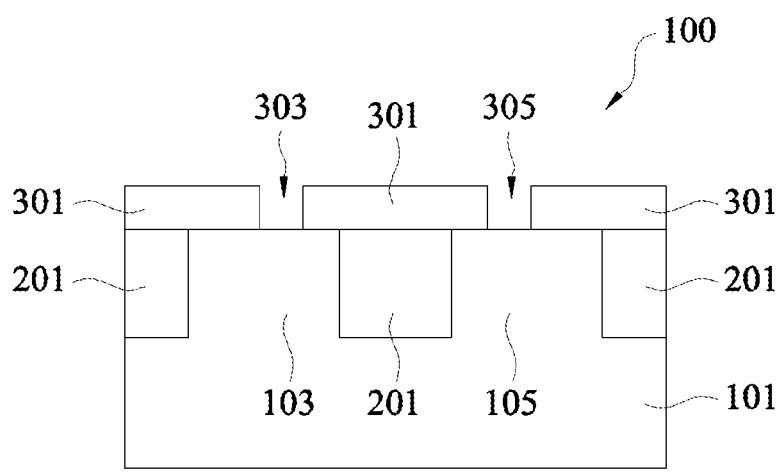

Referring to FIGS. 3A and 3B, a dielectric layer 301 is formed over the STI structure 201, the first source/drain feature 103, and the second source/drain feature 105. In some embodiments, the dielectric layer 301 may comprise silicon nitride, silicon oxide, aluminum oxide, silicon carbide, silicon oxynitride, or the like, and may be formed using, for example, CVD, plasma-enhanced CVD (PECVD), low-pressure LPCVD, a thermal oxidation method, and the like.

In some embodiments, the dielectric layer 301 is patterned using, for example, suitable lithography and etch processes to form a first opening 303 and a second opening 305 therein. The first opening 303 exposes the first source/drain feature 103 and the second opening 305 exposes the second source/drain feature 105 as illustrated in FIGS. 3A and 3B. In the illustrated embodiment, top-view shapes of the first opening 303 and the second opening 305 are circles. However, in other embodiments, the top-view shapes of the first opening 303 and the second opening 305 may be polygons such as triangles, rectangles, hexagons, or the like. In some embodiments, the first opening 303 and the second opening 305 have a same lateral dimension $D_1$ between about 2 nm and about 50 nm. As described below in greater detail, vertical nanowires (see FIGS. 4A and 4B) are formed in the first opening 303 and the second opening 305 and the dielectric layer 301 acts as a template layer for nanowire formation. Accordingly, the dielectric layer 301 may also be referred to as a template layer 301. Moreover, widths of the subsequently formed nanowires may be controlled by lateral dimensions of the openings. In some embodiments, widths of the nanowires may equal to the lateral dimensions of corresponding openings.

Referring further to FIGS. 3A and 3B, in the illustrated embodiment, a single pair of openings (such as the first opening 303 and the second opening 305) is formed in the template layer 301. However, one having ordinary skill in the art would appreciate that more than a single pair of openings may be formed in the template layer 301 depending on a number of semiconductor devices (such as the semiconductor device 100) that are subsequently formed on the substrate 101. As described below in greater detail, a distance between a pair of openings (such as the first opening 303 and the second opening 305) determines a channel length of the subsequently formed semiconductor device (such as the semiconductor device 100). Accordingly, by forming a plurality of opening pairs having different distances between openings, semiconductor devices of different channel lengths may be formed. In some embodiments, the plurality of opening pairs may be formed using a single patterning process. Accordingly, the channel lengths of the semiconductor devices may be advantageously controlled by a single patterning process. In some embodiment, a distance $D_2$ between the first opening 303 and the second opening 305 is between about 5 nm and about 100 nm.

Figure 4A:
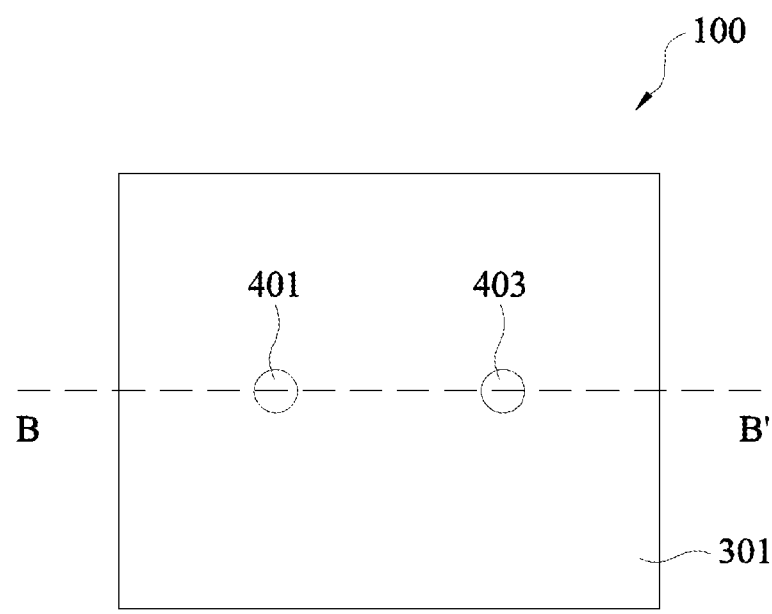
Figure 4B:
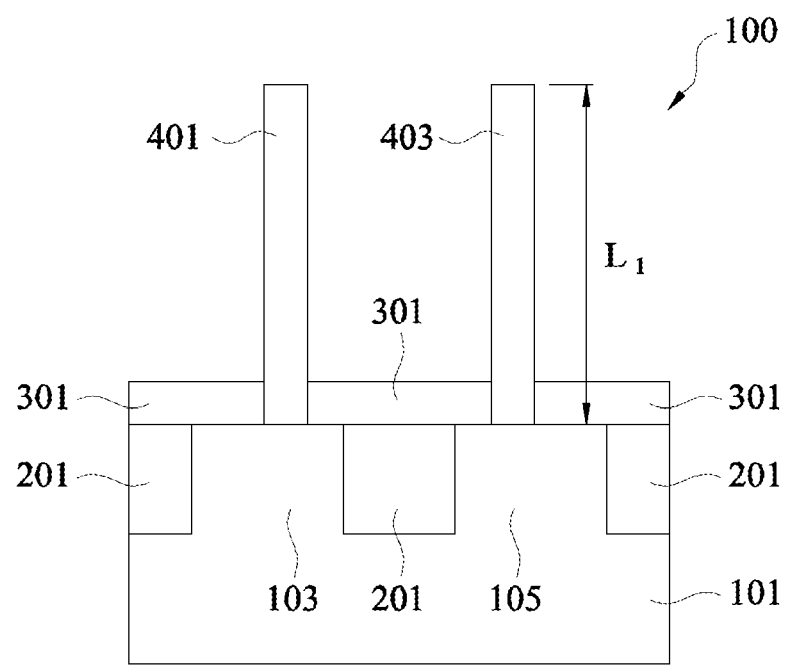

Referring to FIGS. 4A and 4B, a first nanowire 401 and a second nanowire 403 are formed in the first opening 303 and the second opening 305, respectively. As described below in greater detail, the first nanowire 401 and the second nanowire 403 form vertical portions of a channel of the semiconductor device 100. In some embodiments, the first nanowire 401 and the second nanowire 403 may comprise III-V compound semiconductor materials, and may be epitaxial grown using, for example, a selective-area Metal-Organic Chemical Vapor Deposition (MOCVD). Typical group III materials may include gallium (Ga), indium (In), and aluminum (Al), and suitable precursors thereof may include trimethyl indium (TMIn), triethyl gallium (TEGa), trimethyl gallium (TMGa), trimethyl aluminum (TMAl), tritertiarybutyl aluminum (TTBAl), or the like. Typical group V materials may include arsenic (As), antimony (Sb), phosphorus (P), and bismuth (Bi), and suitable precursors thereof may include tributyl arsenic (TBA), arsine (AsH₃), phosphine (PH₃), tributyl phosphorus (TBP), trimethyl antimony (TMSb), triethyl antimony (TESb), triphenyl bismuth (TPB), or the like.

In some embodiments, process parameters of the epitaxial growth process may be adjusted such that the first nanowire 401 and the second nanowire 403 predominantly grow in a vertical direction (a direction substantially perpendicular to the top surfaces of the first source/drain feature 103 and the second source/drain feature) while maintaining widths determined by the lateral dimension $D_1$ of the first opening 303 and the second opening 305. Accordingly, the lateral dimension $D_1$ of the first opening 303 and the second opening 305 controls widths of the first nanowire 401 and the second nanowire 403. In some embodiments, lengths of the first nanowire 401 and the second nanowire 403 are controlled by a duration of the epitaxial growth process. In some embodiments wherein the first nanowire 401 and the second nanowire 403 are formed by a same epitaxial growth process, lengths of the first nanowire 401 and the second nanowire 403 may be substantially the same. In some embodiments, a length $L_1$ of the first nanowire 401 and the second nanowire 403 is between about 5 nm and about 5 µm.

Figure 5A:
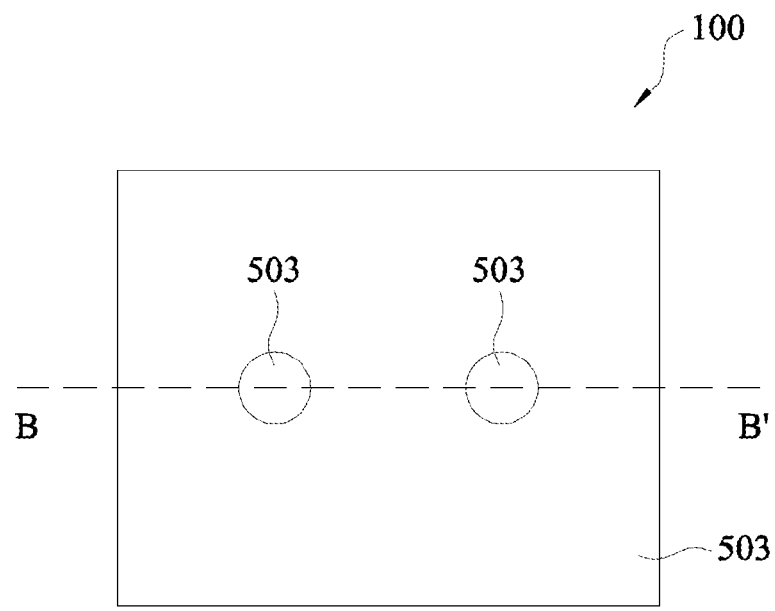

Referring to FIGS. 5A through 6B, a first portion of a gate stack comprising a gate dielectric layer 501 and a work function layer 503 is formed wrapping the first nanowire 401 and the second nanowire 403. Turning first to FIGS. 5A and 5B, the gate dielectric layer 501 is formed over the template layer 301 and top surfaces and sidewalls of the first nanowire 401 and the second nanowire 403. In some embodiments, the gate dielectric layer 501 comprises one or more layers of high-k dielectric materials. Generally, a high-k dielectric material has a dielectric constant (k-value) higher than 3.9. For example, the gate dielectric layer 501 may include one or more layers of a metal oxide or a silicate of Hf, Al, Zr, combinations thereof, or multi-layers thereof. Other suitable materials may include La, Mg, Ba, Ti, Pb in the form of metal oxides, metal alloyed oxides, or combinations thereof. In some embodiments, the gate dielectric layer 501 may be formed using atomic layer deposition (ALD), CVD, PECVD, molecular-beam deposition (MBD), or the like.

Figure 5B:
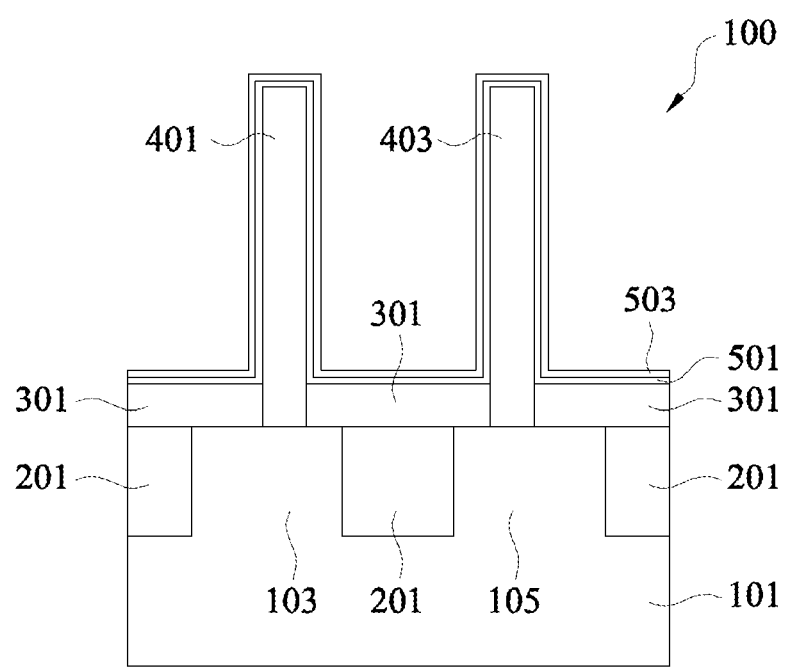

Referring further to FIGS. 5A and 5B, in some embodiments the work function layer 503 is formed over the gate dielectric layer 501. The work function layer 503 may be used to adjust a work function of a subsequently formed gate electrode layer to exhibit the work function suitable to a particular type of the semiconductor device 100 such as, for example, an NFET or a PFET. In some embodiments wherein the semiconductor device 100 is an NFET, the work function layer 503 may comprise one or more layers of, for example, Ti, Ag, Al, TiAl, TiAlN, TiAlC, TaC, TaCN, TaSiN, TaAlC, Mn, Zr, or the like. In other embodiments wherein the semiconductor device 100 is a PFET, the work function layer 503 may comprise one or more layers of, for example TiN, WN, TaN, Ru, Co, or the like. In some embodiments the work function layer 503 may be formed using ALD, CVD, PECVD, MBD, or the like.

Figure 6A:
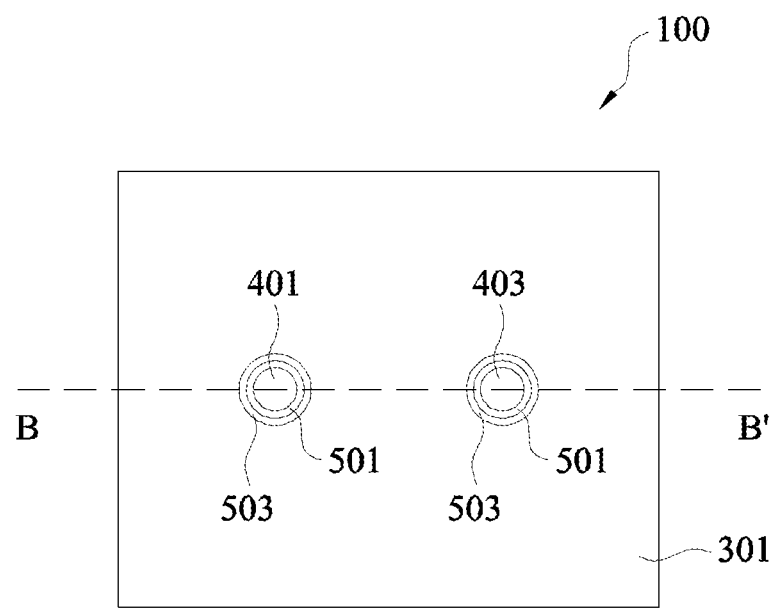
Figure 6B:
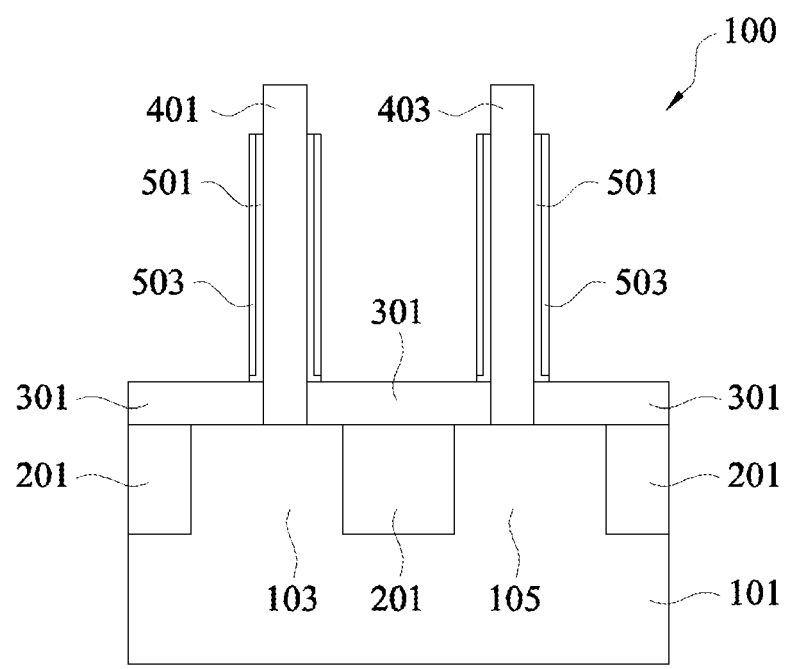

Referring to FIGS. 6A and 6B, portions of the gate dielectric layer 501 and the work function layer 503 are removed such that the gate dielectric layer 501 and the work function layer 503 remain on the sidewalls of the first nanowire 401 and the second nanowire 403. In addition, top portions of the first nanowire 401 and the second nanowire 403 are also exposed. In some embodiments, the portions of the gate dielectric layer 501 and the work function layer 503 may be removed using, for example, a suitable anisotropic etch process.

Figure 7A:
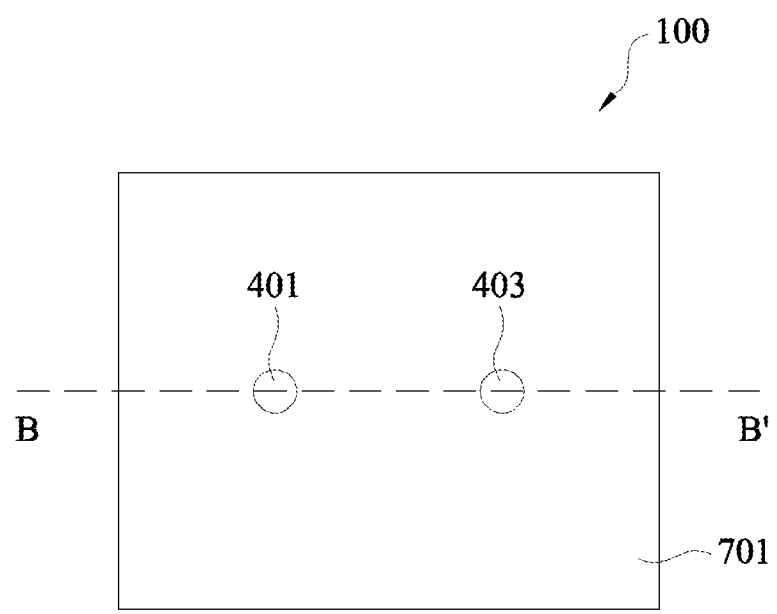
Figure 7B:
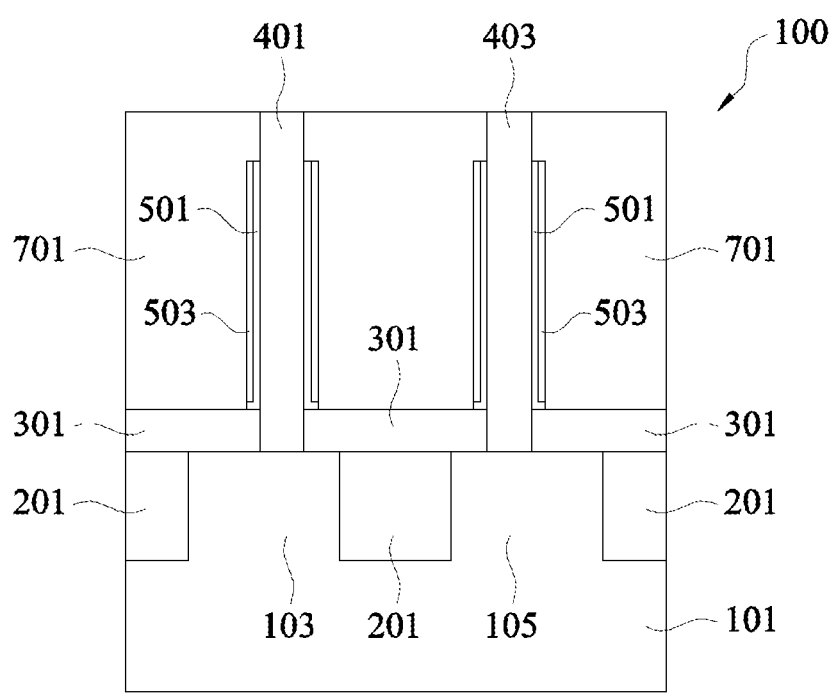

Referring to FIGS. 7A and 7B, a dielectric layer 701 is formed over the substrate 101 and surrounding the first nanowire 401 and the second nanowire 403. The dielectric layer 701 may be formed of similar candidate materials and using similar candidate methods as the STI structure 201 and the description is not repeated herein. Subsequently, portions of the dielectric layer 701 extending over the top surfaces of the first nanowire 401 and the second nanowire are removed to expose the top surfaces of the first nanowire 401 and the second nanowire 403 such that the top surfaces of the first nanowire 401 and the second nanowire are substantially coplanar with a top surface of the dielectric layer 701. In some embodiments, excess portions of the dielectric layer 701 may be removed using, for example, an etch process, a grinding process, a CMP process, and the like.

Figure 8A:
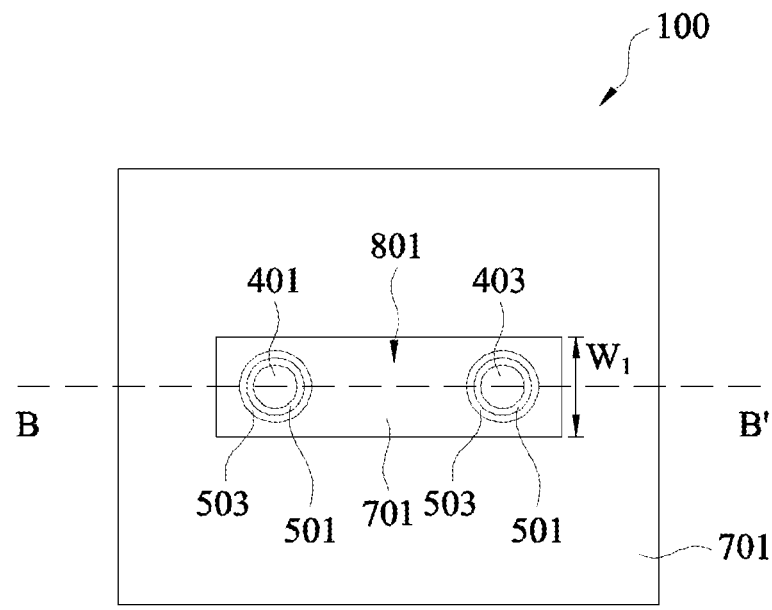
Figure 8B:
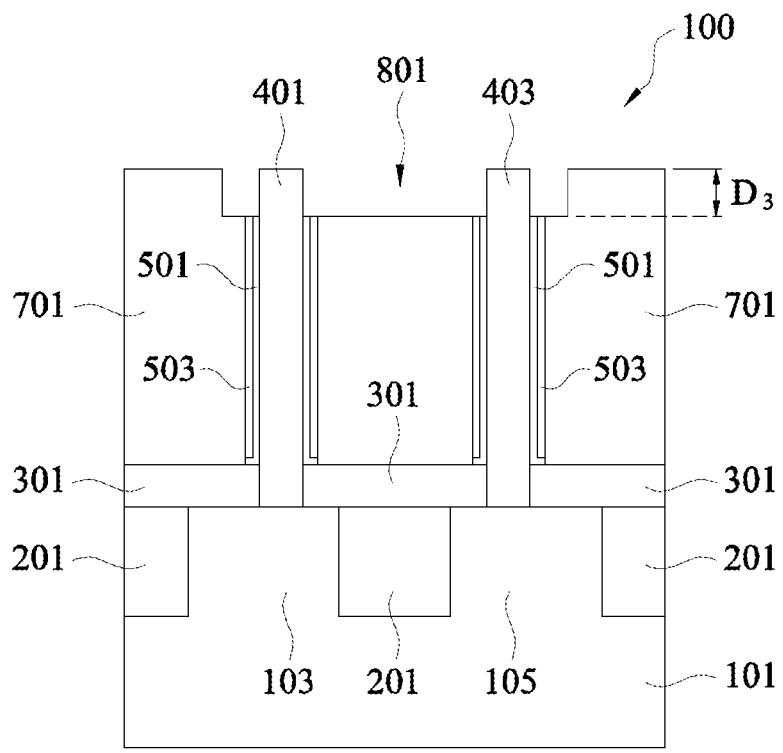

Referring to FIGS. 8A and 8B, an opening 801 is formed in the dielectric layer 701 to expose top portions of the first nanowire 401 and the second nanowire 403. In some embodiments, the dielectric layer 701 is patterned using suitable lithography and etch processes to form the opening 801. In some embodiments, the opening 801 is formed to a depth such that top surfaces of the gate dielectric layer 501 and the work function layer 503 are exposed. In some embodiments, a width $W_1$ of the opening 801 is between about 2 nm and about 50 nm, and a depth $D_3$ of the opening 801 is between about 2 nm and about 50 nm. As described below in greater detail, a third nanowire 901 (see FIGS. 9A and 9B) is formed in the in the opening 801. In some embodiments, the third nanowire 901 acts as a horizontal portion of the channel of the semiconductor device 100.

Figure 9A:
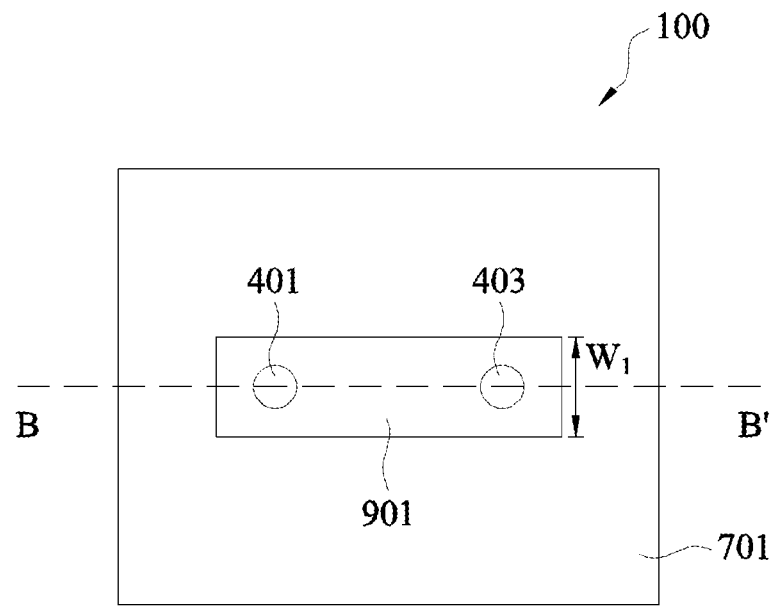
Figure 9B:
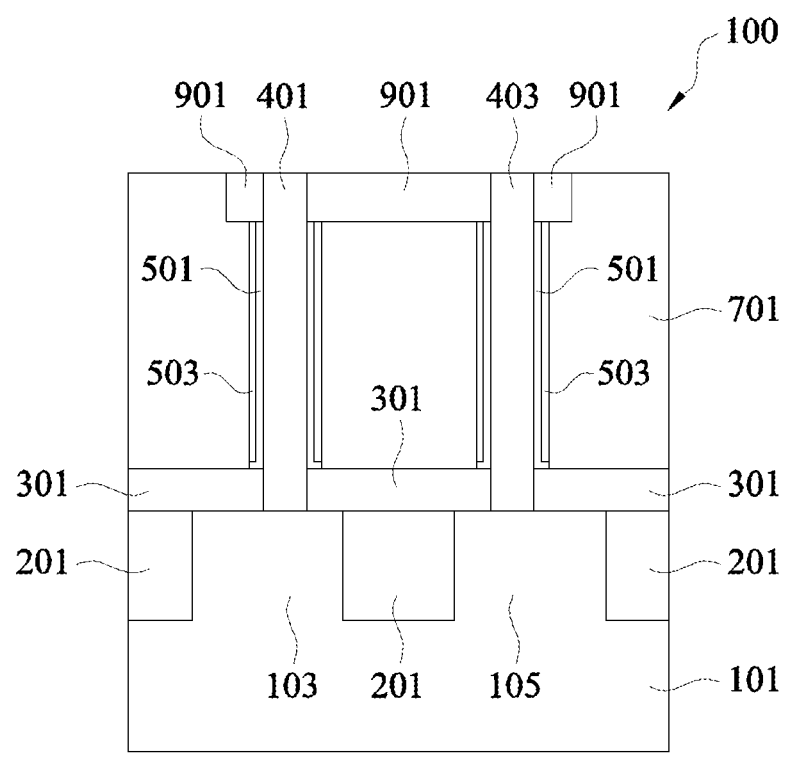

Referring to FIGS. 9A and 9B, the third nanowire 901 is formed in the opening 801. In some embodiments, the third nanowire 901 forms the horizontal portion of the channel of the semiconductor device 100. In the illustrated embodiment, the channel comprises the first nanowire 401, the second nanowire 403, and the third nanowire 901. In some embodiments, the third nanowire 901 may be formed of similar candidate materials (such as III-V compound semiconductor materials) as the first nanowire 401 and the second nanowire 403 and the description is not repeated herein. In some embodiments, the third nanowire 901 may be formed using an epitaxial growth method. In other embodiments, the third nanowire 901 may be formed using any suitable deposition method. Subsequently, portions of the third nanowire 901 extending over the dielectric layer 701 may be removed such that a top surface of the third nanowire 901 is substantially coplanar with a top surface of the dielectric layer 701. In some embodiments, excess portions of the third nanowire 901 may be removed using, for example, an etch process, a grinding process, a CMP process, and the like. A size of the third nanowire 901 is determined by a size of the opening 801 and, therefore, the third nanowire 901 may be also referred to as a lithographically formed nanowire, while the first nanowires 401 and the second nanowire 403 may be also referred to as epitaxially formed nanowires. In the illustrated embodiment, a width of the third nanowire 901 is equal to the width $W_1$ of the opening 801 and a height of the third nanowire 901 is equal to the depth $D_3$ of the opening 801.

Figure 10A:
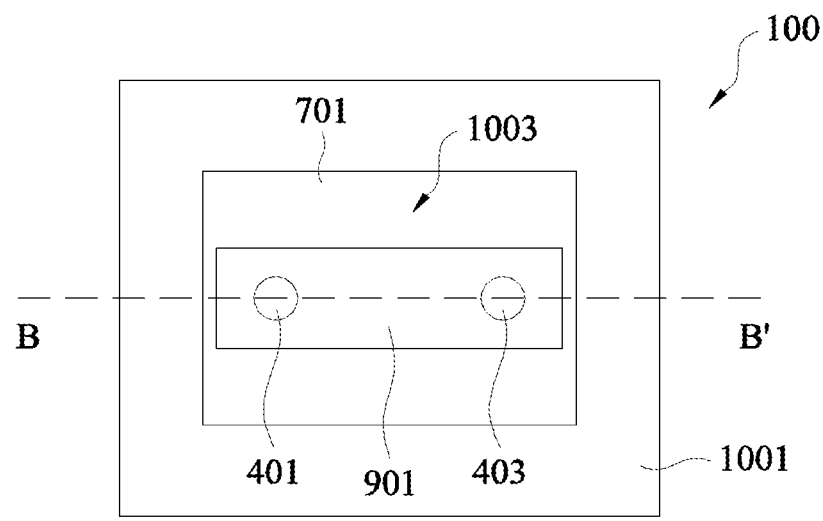
Figure 10B:
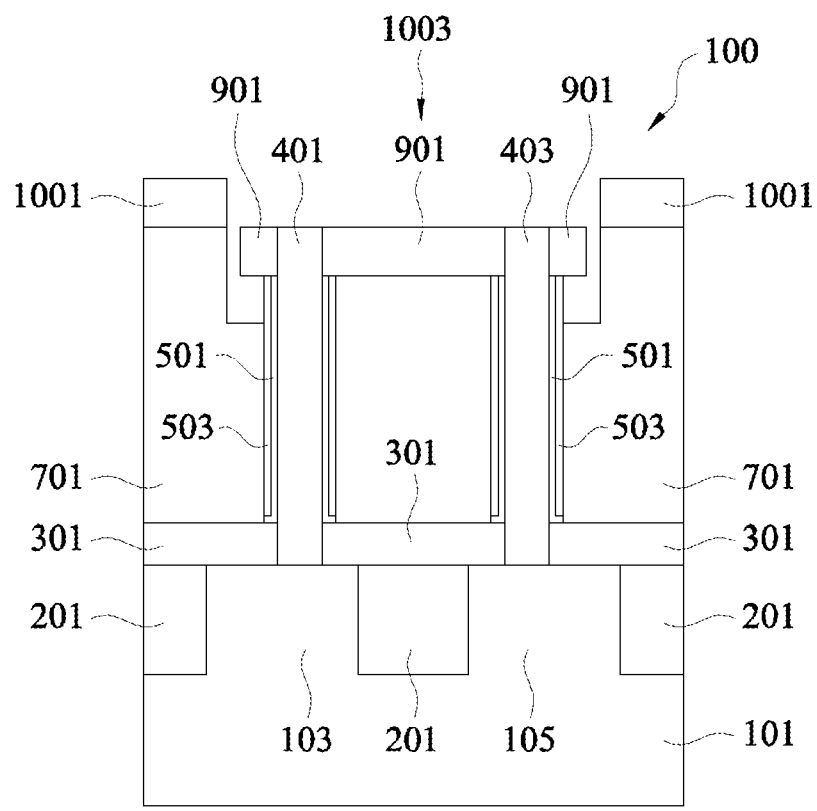

Referring to FIGS. 10A and 10B, a dielectric layer 1001 is formed over the dielectric layer 701 and the third nanowire 901. In some embodiments, the dielectric layer 1001 may be formed of similar candidate materials and using similar candidate methods as the STI structure 201 and the description is not repeated herein. In some embodiments, the dielectric layer 701 and the dielectric layer 1001 may comprise a same material. In other embodiments, the dielectric layer 701 and the dielectric layer 1001 may comprise different materials. Subsequently, a top surface of the dielectric layer 1001 may be planarized using, for example, a grinding process, a CMP process, and the like.

Referring further to FIGS. 10A and 10B, an opening 1003 is formed from a top surface of the dielectric layer 1001. In some embodiments, the opening 1003 extends through the dielectric layer 1001 and into the dielectric layer 701 such that sidewalls, and top and bottom surfaces of the third nanowire 901 are exposed. As described below in greater detail, a second portion of the gate stack is formed in the opening 1003. In some embodiments, the dielectric layer 1001 and the dielectric layer 701 may be patterned using suitable lithography and etch processes. In some embodiments wherein the dielectric layer 701 and the dielectric layer 1001 comprise a same material, the dielectric layer 701 and the dielectric layer 1001 may be selectively etched using a single etch process. In other embodiments wherein the dielectric layer 701 and the dielectric layer 1001 comprise different materials, the dielectric layer 701 and the dielectric layer 1001 may be selectively etched using multiple etch process (for example, two etch processes).

Figure 11A:
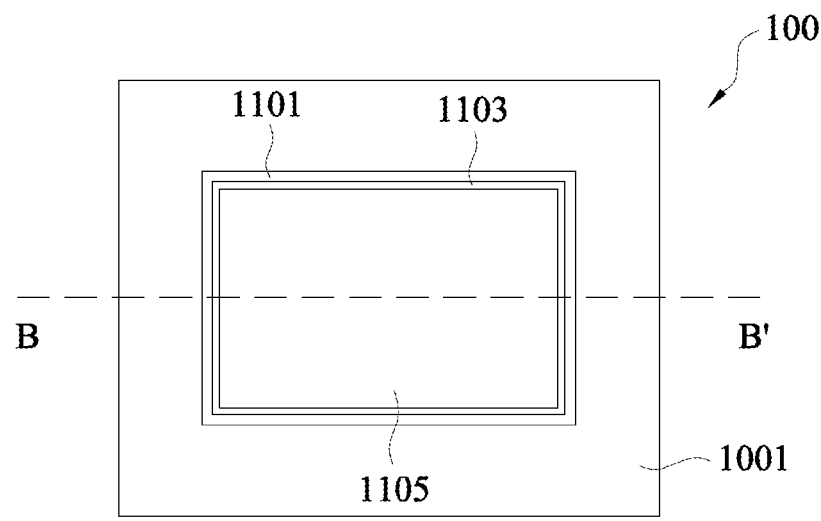
Figure 11B:
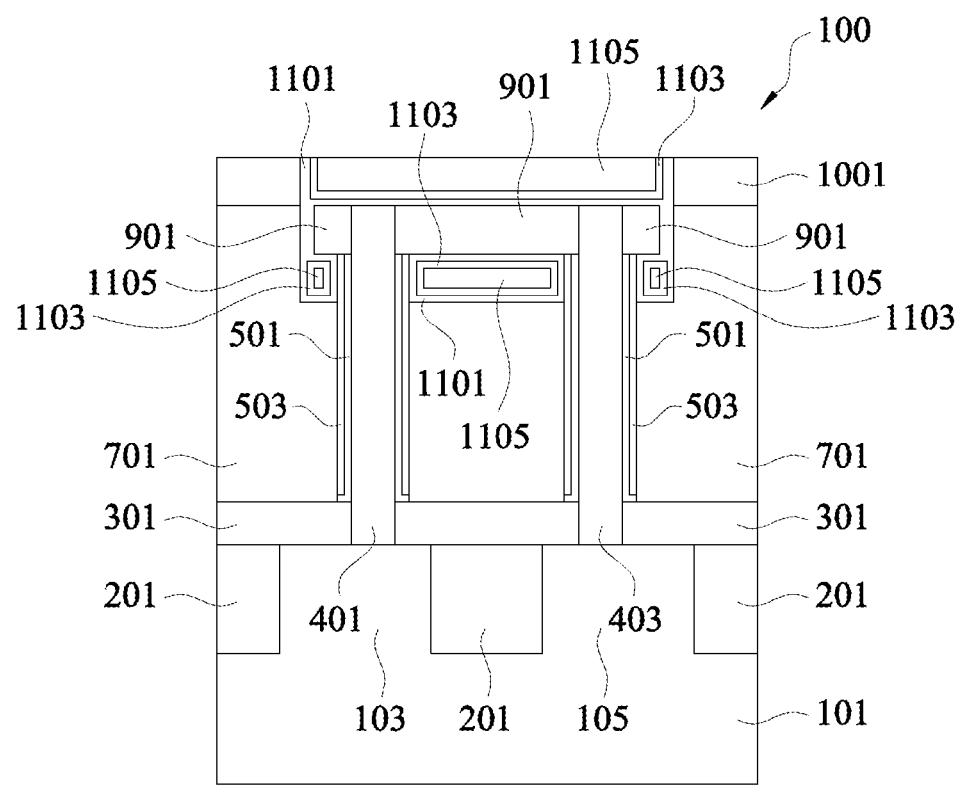

Referring to FIGS. 11A and 11B, a second portion of the gate stack comprising a gate dielectric layer 1101, a work function layer 1103 and gate electrode 1105 is formed in the opening 1003. In the illustrated embodiment, the second portion of the gate stack wraps around the third nanowire 901. In some embodiments, the gate dielectric layer 1101 is conformally formed on sidewalls and a bottom of the opening 1003, and on exposed surfaces of the third nanowire 901. In some embodiments, the gate dielectric layer 1101 is formed using similar materials and methods as the gate dielectric layer 501 and the description is not repeated herein. Subsequently, the work function layer 1103 is conformally formed on the gate dielectric layer 1101. In some embodiments, the work function layer 1103 is formed using similar materials and methods as the work function layer 503 and the description is not repeated herein.

Referring further to FIGS. 11A and 11B, the gate electrode 1105 is formed on exposed surfaces of the work function layer 1103. In some embodiments, the gate dielectric layer 1101 and the work function layer 1103 do not completely fill the opening 1003, and the remaining portion of the opening 1003 may be filled by the gate electrode 1105. In some embodiments, the gate electrode 1105 may comprise a metallic material such as gold, silver, aluminum, copper, tungsten, molybdenum, nickel, titanium, or alloys thereof, and may be formed using physical vapor deposition (PVD), ALD, plating, or the like. Subsequently, portions of the gate dielectric layer 1101, the work function layer 1103 and the gate electrode 1105 extending over the dielectric layer 1001 may be removed such that top surfaces of the gate dielectric layer 1101, the work function layer 1103 and the gate electrode 1105 are substantially coplanar with the top surface of the dielectric layer 1001. In some embodiments, excess materials may be removed using, for example, an etch process, a grinding process, a CMP process, and the like.

Figure 12A:
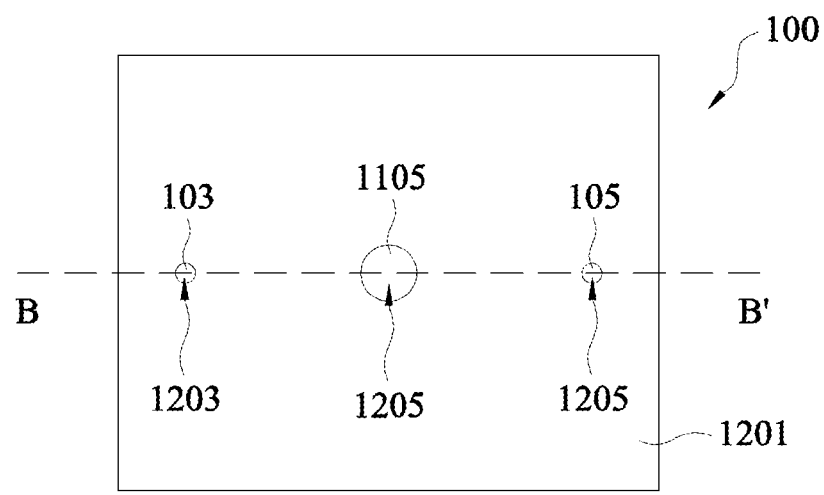
Figure 12B:
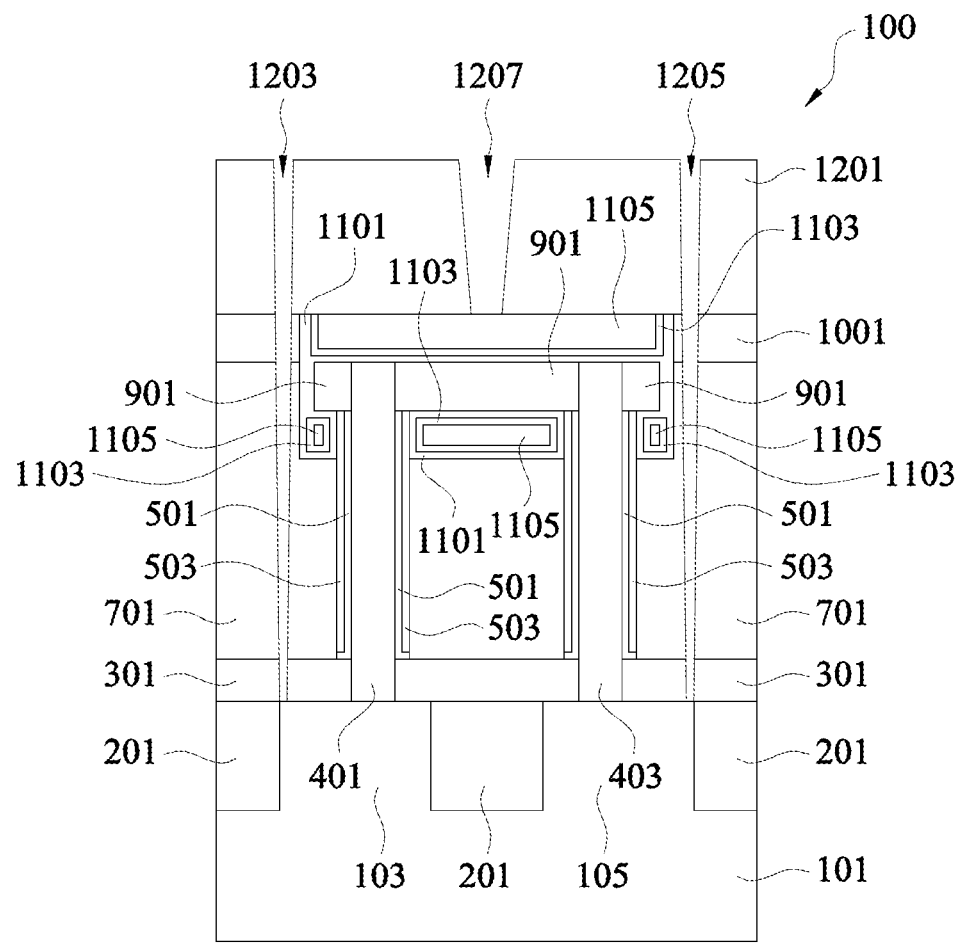

Referring to FIGS. 12A and 12B, an interlayer dielectric (ILD) layer 1201 is formed over the dielectric layer 1001. In some embodiments, the ILD layer 1201 is formed of one or more layers of a dielectric material, such as silicon oxide, low-k dielectrics or other suitable materials, by a suitable technique, such as CVD, ALD, spin-on, or the like. In some embodiments, the ILD layer 1201 is planarized using, for example, a grinding process, a CMP process, or the like.

Referring further to FIGS. 12A and 12B, a first opening 1203, a second opening 1205, and a third opening 1207 are formed from a top surface of the ILD layer 1201. In some embodiments, the first opening 1203, the second opening 1205, and the third opening 1207 are formed using suitable lithography and etching processes. In the illustrated embodiment, the first opening 1203 extends through the ILD layer 1201, the dielectric layers 1001 and 701 and the template layer 301, and exposes the first source/drain feature 103. The second opening 1205 extends through the ILD layer 1201, the dielectric layers 1001 and 701 and the template layer 301, and exposes the second source/drain feature 105. The third opening 1207 extends through the ILD layer 1201 and exposes the gate electrode 1105.

Figure 13A:
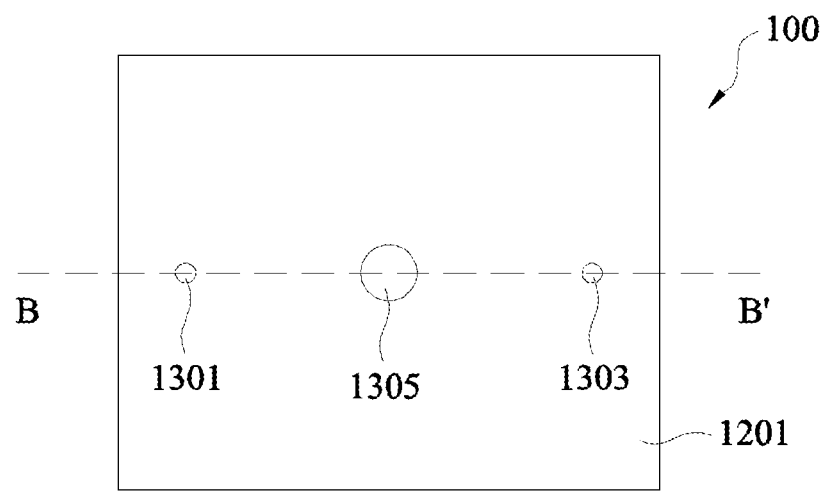
Figure 13B:
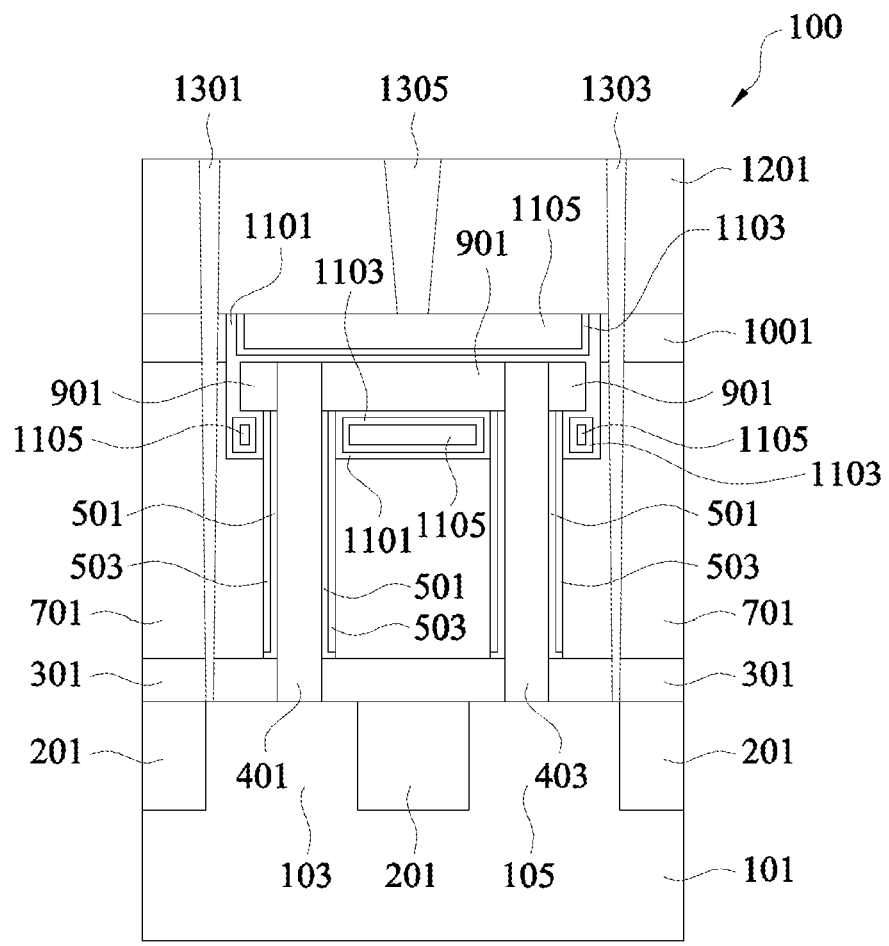

Referring to FIGS. 13A and 13B, a first contact plug 1301, a second contact plug 1303, and a third contact plug 1305 are formed in the first opening 1203, the second opening 1205, and the third opening 1207, respectively. In some embodiments, one or more barrier/adhesion layers (not shown) are conformally formed in the first opening 1203, the second opening 1205, and the third opening 1207. The one or more barrier/adhesion layers protect neighboring layers (such as, for example, the ILD layer 1201, the dielectric layers 701 and 1001, and the template layer 301) from metallic diffusion. The one or more barrier/adhesion layers may comprise titanium, titanium nitride, tantalum, tantalum nitride, or the like and may be formed using PVD, CVD, ALD, the like, or a combination thereof. In some embodiments, a seed layer (not shown) is conformally formed over the one or more barrier/adhesion layers. The seed layer may comprise copper, titanium, nickel, gold, manganese, the like, or a combination thereof, and may be formed by ALD, PVD, the like, or a combination thereof.

Referring further to FIGS. 13A and 13B, the first contact plug 1301, the second contact plug 1303, and the third contact plug 1305 are formed by filling the first opening 1203, the second opening 1205, and the third opening 1207, respectively, with a suitable conductive material. In some embodiments, the first contact plug 1301, the second contact plug 1303, and the third contact plug 1305 may comprise copper, a copper alloy, silver, gold, tungsten, tantalum, aluminum, and the like, and may be formed using an electro-chemical plating process, an electroless plating process, ALD, PVD, the like, or a combination thereof.

In some embodiments, excess materials overfilling the first opening 1203, the second opening 1205, and the third opening 1207 are removed such that the topmost surfaces of the first contact plug 1301, the second contact plug 1303, and the third contact plug 1305 are substantially coplanar with the topmost surface of the ILD layer 1201. In some embodiments, the excess materials are removed using, for example, a mechanical grinding process, a CMP process, an etching process, the like, or a combination thereof.

Referring further to FIGS. 13A and 13B, in the illustrated embodiment, top-view shapes of the first contact plug 1301, the second contact plug 1303, and the third contact plug 1305 are circles. However, in other embodiments, the top-view shapes of the first contact plug 1301, the second contact plug 1303, and the third contact plug 1305 may be polygons such as triangles, rectangles, hexagons, or the like. Furthermore, locations of the first contact plug 1301, the second contact plug 1303, and the third contact plug 1305, as shown in FIGS. 13A and 13B, are provided as examples and are not limiting. In other embodiments, the first contact plug 1301, the second contact plug 1303, and the third contact plug 1305 may be formed at other locations based on design requirements for the semiconductor device 100.

In some embodiments, further manufacturing steps may be performed on the semiconductor device 100. For example, metallization layers (not shown) may be formed over the ILD layer 1201. The metallization layers may comprise one or more dielectric layers, and one or more conductive features formed in the one or more dielectric layers. In some embodiments, the metallization layers are in electrical contact with the first contact plug 1301, the second contact plug 1303, and the third contact plug 1305, and electrically interconnect the semiconductor device 100 to other devices formed on the substrate 101. In some embodiments, the further manufacturing steps may also include formation of one or more redistribution layers (RDLs) over the metallization layers, formation of under-bump metallizations (UBMs) over the RLDs, and formation of connectors over the UBMs. Subsequently, the substrate 101 may be singulated into separate dies, which may further undergo various packaging processes.

Figure 14:
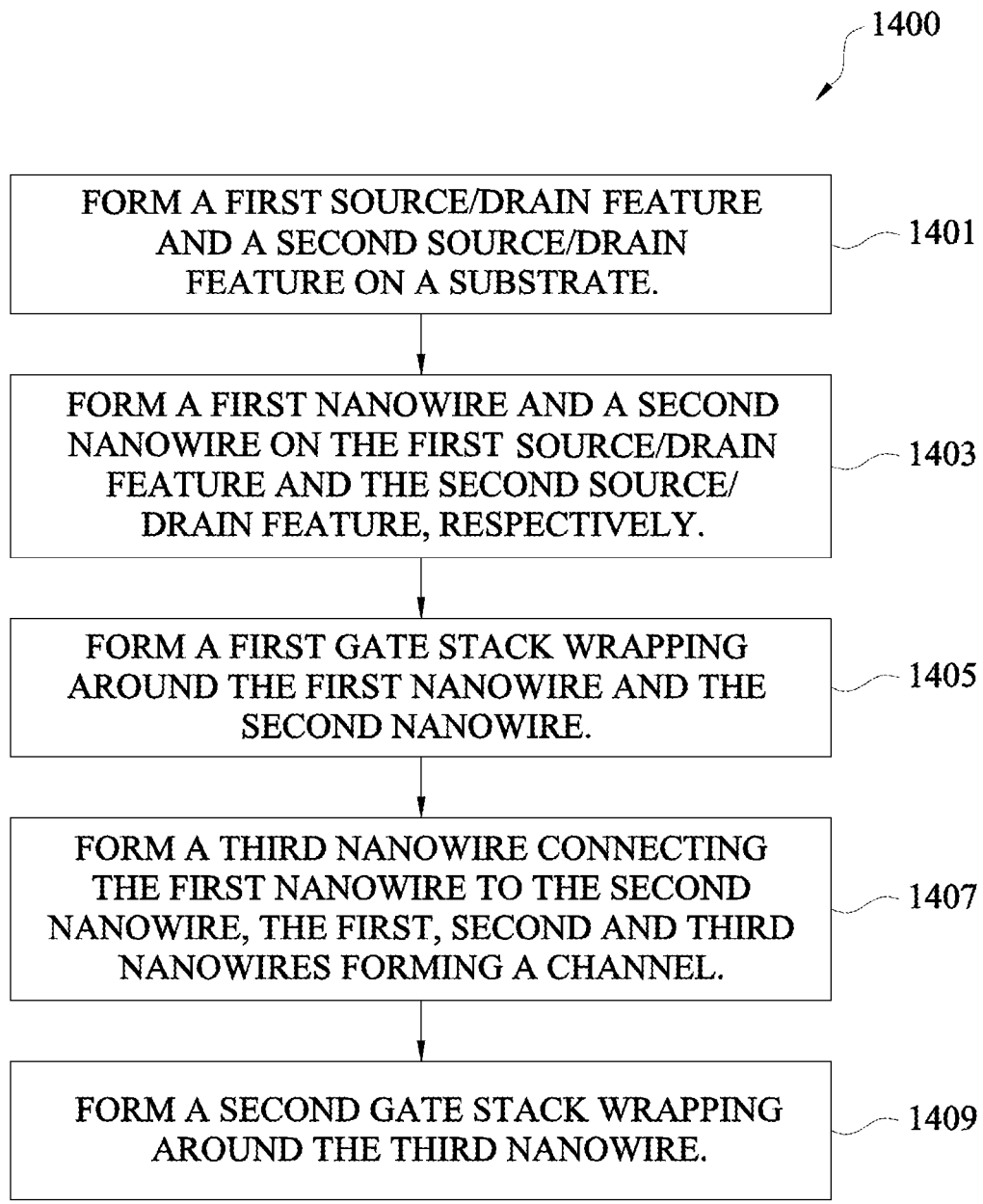
FIG. 14 is a flow diagram illustrating a method of forming a semiconductor device in accordance with some embodiments.

FIG. 14 is a flow diagram illustrating a method 1400 of forming the semiconductor device 100 in accordance with some embodiments. The method 1400 starts with step 1401, wherein a first source/drain feature (such as first source/drain feature 103) and a second source/drain feature (such as the second source/drain feature 105) are formed on a substrate (such as the substrate 101) as described above with reference to FIGS. 1A-2B. In step 1403, a first nanowire (such as the first nanowire 401) and a second nanowire (such as the second nanowire 403) are formed on the first source/drain feature and the second source/drain feature as described above with reference to FIGS. 3A-4B. In some embodiments, the first nanowire and the second nanowire are substantially perpendicular to top surfaces of the first source/drain feature and the second source/drain feature. In step 1405, a first gate stack (such as the gate dielectric layer 501 and the work function layer 503) is formed wrapping around the first nanowire and the second nanowire as described above with reference to FIGS. 5A-6B. In step 1407, a third nanowire (such as the third nanowire 901) connecting the first nanowire to the second nanowire is formed as described with reference to FIGS. 7A-9B. In some embodiment, the third nanowire is substantially parallel to the top surfaces of the first source/drain feature and the second source/drain feature. In some embodiments, the first nanowire, the second nanowire and the third nanowire form a channel of the semiconductor device 100. In step 1409, a second gate stack (such as the gate dielectric layer 1101, the work function layer 1103 and the gate electrode 1105) is formed wrapping around the third nanowire as described above with reference to FIGS. 10A-11B.

FIGS. 15A-24B illustrate various intermediate stages of fabrication of a semiconductor device 1500 in accordance with some embodiments. FIGS. 15A-24B illustrate top and cross-sectional views, wherein an "A" figure represents a top view and a "B" figure represents a cross-sectional view along the B-B' line of the respective "A" figure. As described above with reference to FIGS. 5A-11B, the first portion of the gate stack of the semiconductor device 100 is formed after forming the first nanowire 401 and second nanowire 403, but before forming the third nanowire 901, and the second portion of the gate stack of the semiconductor device 100 is formed after forming the third nanowire 901. As described below in greater detail, a gate stack of the semiconductor device 1500 is formed during a single step after all nanowires are formed.

Figure 15A:
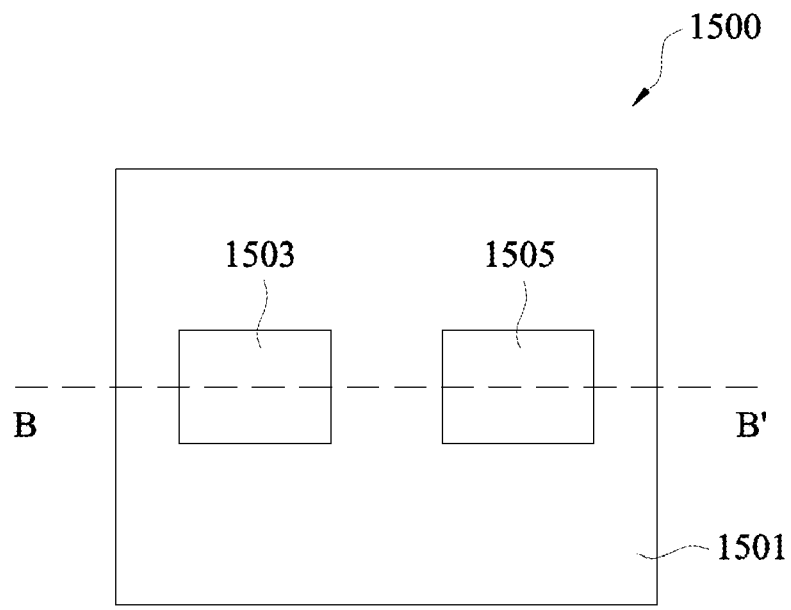
FIGS. 15A-24B illustrate various top and cross-sectional views of a fabrication process of a semiconductor device in accordance with some embodiments.
Figure 15B:
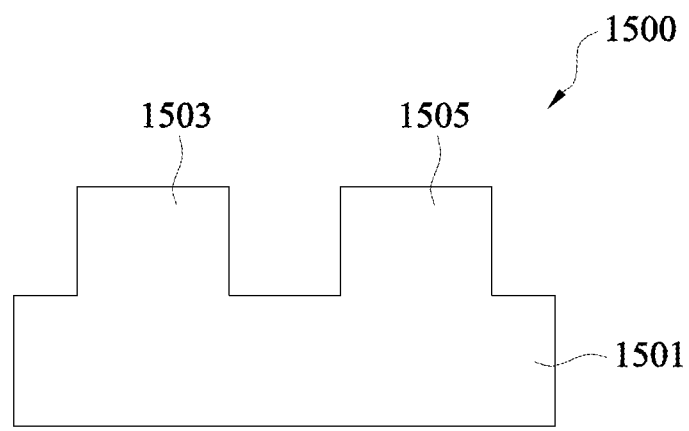

Referring first to FIGS. 15A and 15B, a portion of a substrate 1501 having a first feature 1503 and a second feature 1505 formed thereon is illustrated. The substrate 1501 may be formed of similar materials as the substrate 101 (see FIGS. 1A and 1B) and the description is not repeated herein. In some embodiments, the substrate 1501 is patterned to form the first feature 1503 and the second feature 1505. In some embodiments, the first feature 1503 and the second feature 1505 may be formed using similar methods as the first feature 103 and the second feature 105 (see FIGS. 1A and 1B), respectively, and the description is not repeated herein. As described below in greater detail, the first feature 1503 and the second feature 1505 are doped using suitable dopants and act as a first source/drain feature 1503 and a second source/drain feature 1505, respectively.

Figure 16A:
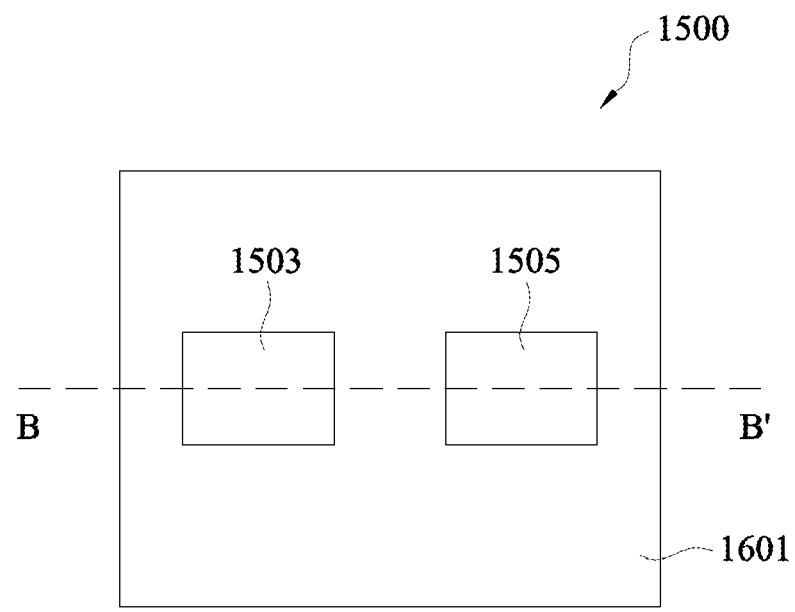
Figure 16B:
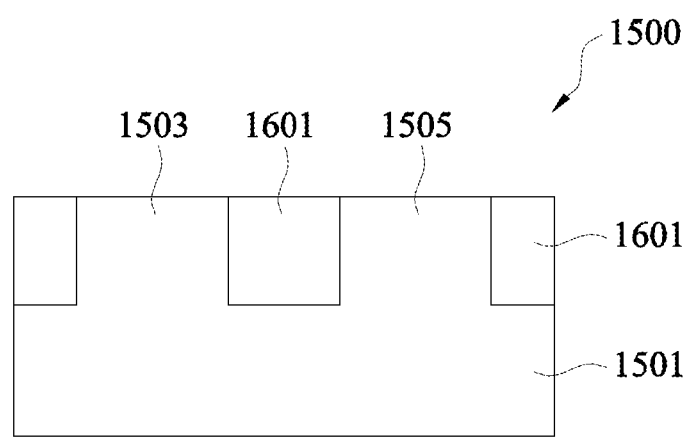

Referring to FIGS. 16A and 16B, an STI structure 1601 is formed over the substrate 1501 and surrounding the first feature 1503 and the second feature 1505. In some embodiments, the STI structure 1601 may be formed using similar material and methods as the STI structure 201 (see FIGS. 2A and 2B) and the description is not repeated herein. Subsequently, the first feature 1503 and the second feature 1505 are doped to form the first source/drain feature 1503 and the second source/drain feature 1505, respectively. In some embodiments, the first feature 1503 and the second feature 1505 may be doped using similar methods as the first feature 103 and the second feature 105, respectively, and the description is not repeated herein.

Figure 17A:
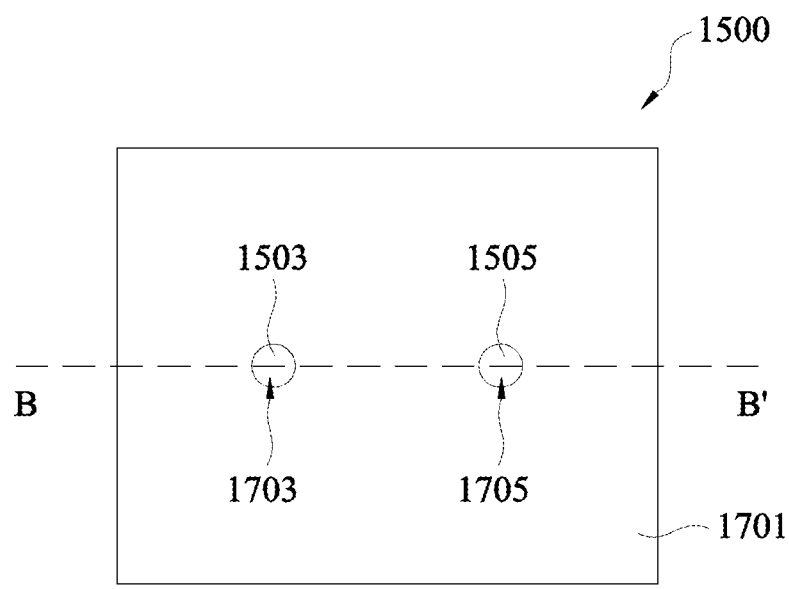
Figure 17B:
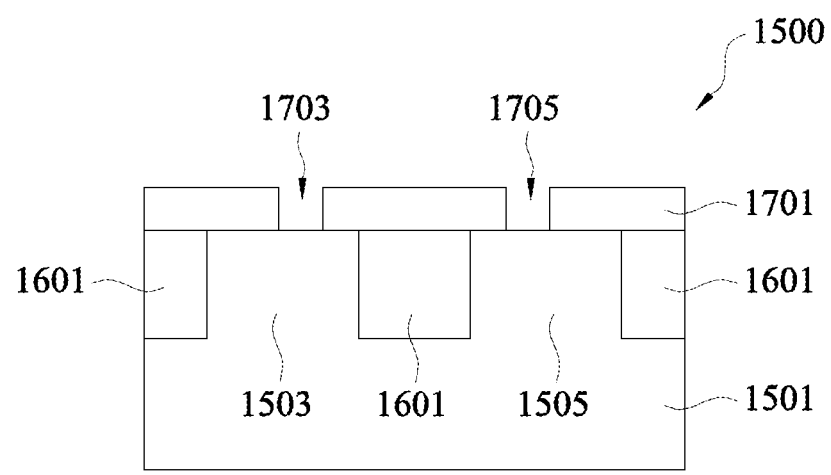

Referring to FIGS. 17A and 17B, a template layer 1701 is formed over the STI structure 1601, the first source/drain feature 1503, and the second source/drain feature 1505. In some embodiments, the template layer 1701 may be formed using similar materials and methods as the template layer 301 (see FIGS. 3A and 3B) and the description is not repeated herein. Subsequently, the template layer 1701 is patterned form a first opening 1703 and a second opening 1705 therein. The first opening 1703 exposes the first source/drain feature 1503 and the second opening 1705 exposes the first source/drain feature 1505 as illustrated in FIGS. 17A and 17B. In some embodiments, the first opening 1703 and the second opening 1705 may be formed using similar methods as the first opening 303 and the second opening 305 (see FIGS. 3A and 3B) and the description is not repeated herein.

Figure 18A:
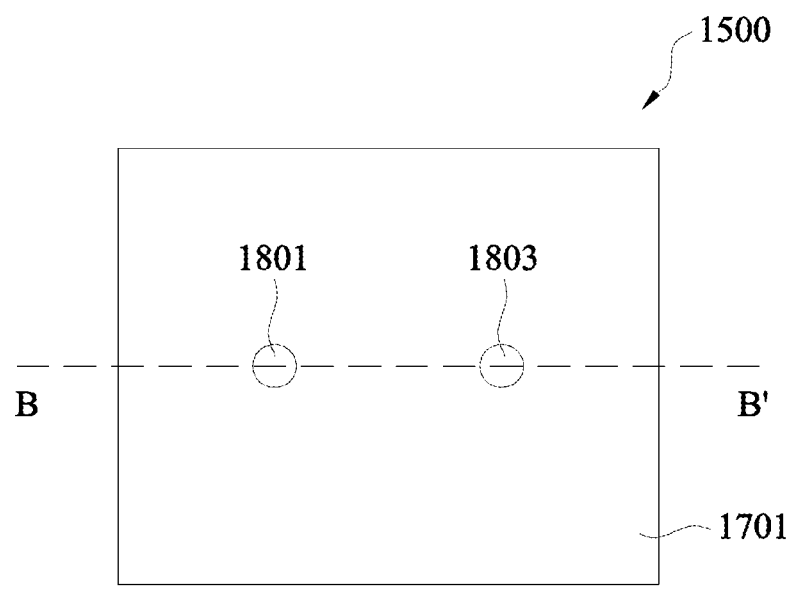
Figure 18B:
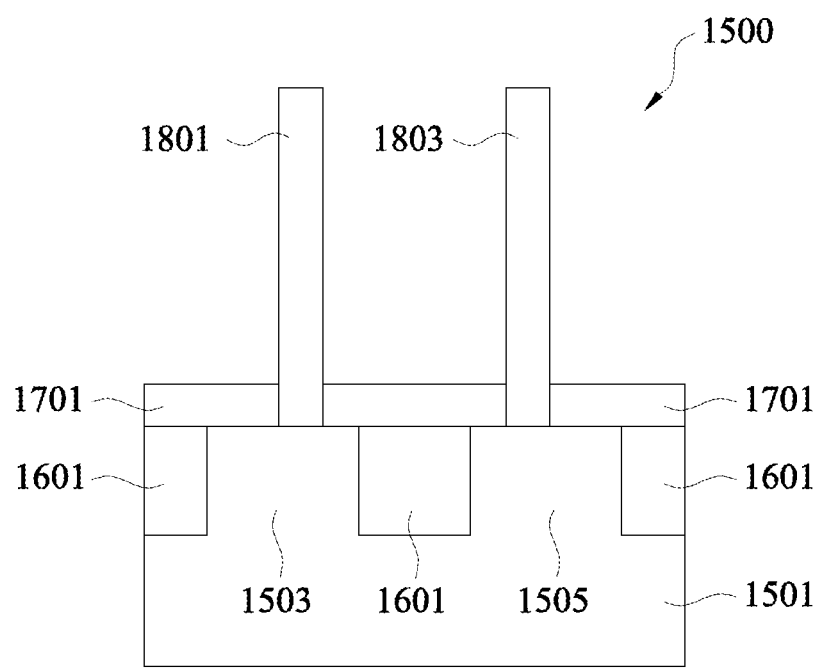

Referring to FIGS. 18A and 18B, a first nanowire 1801 and a second nanowire 1803 are formed in the first opening 1703 and the second opening 1705, respectively. As described below in greater detail, the first nanowire 1801 and the second nanowire 1803 form vertical portions of a channel of the semiconductor device 1500. In some embodiments, the first nanowire 1801 and the second nanowire 1803 may be formed using similar material and methods as the first nanowire 401 and the second nanowire 403 (see FIGS. 4A and 4B) and the description is not repeated herein.

Figure 19A:
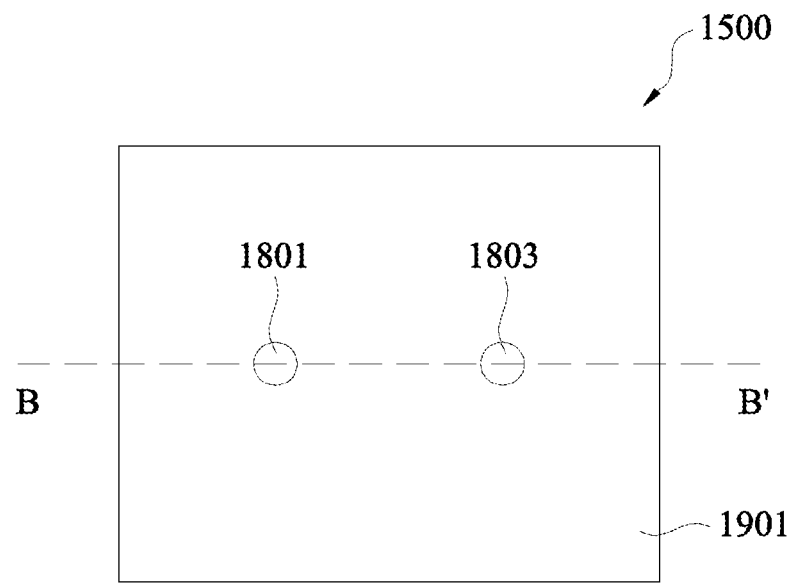
Figure 19B:
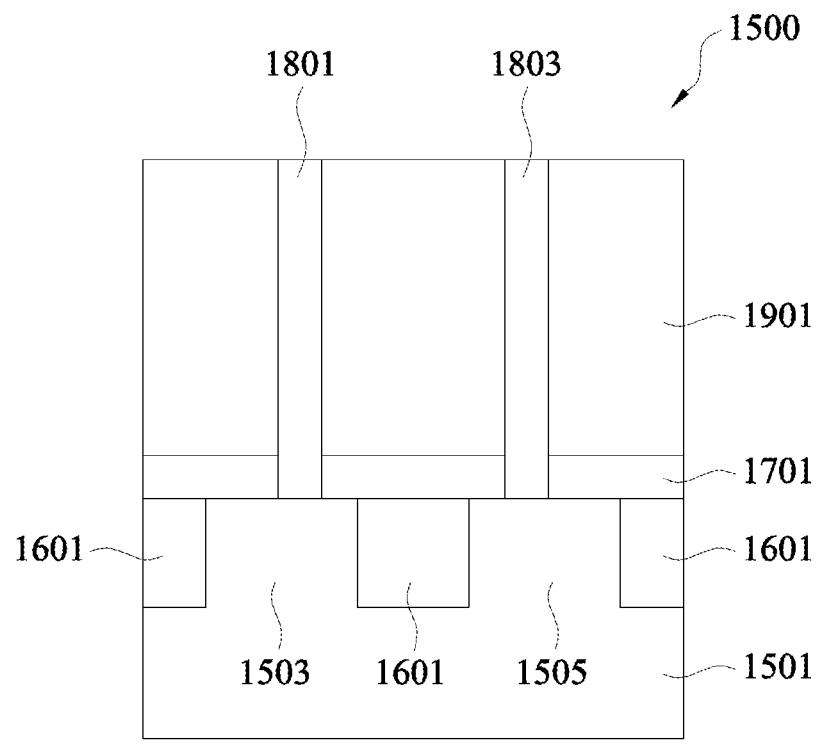

Referring to FIGS. 19A and 19B, a dielectric layer 1901 is formed over the template layer 1701 and surrounding the first nanowire 1801 and the second nanowire 1803. In some embodiments, the dielectric layer 1901 may be formed using similar materials and methods as the dielectric layer 701 (see FIGS. 7A and 7B) and the description is not repeated herein.

Figure 20A:
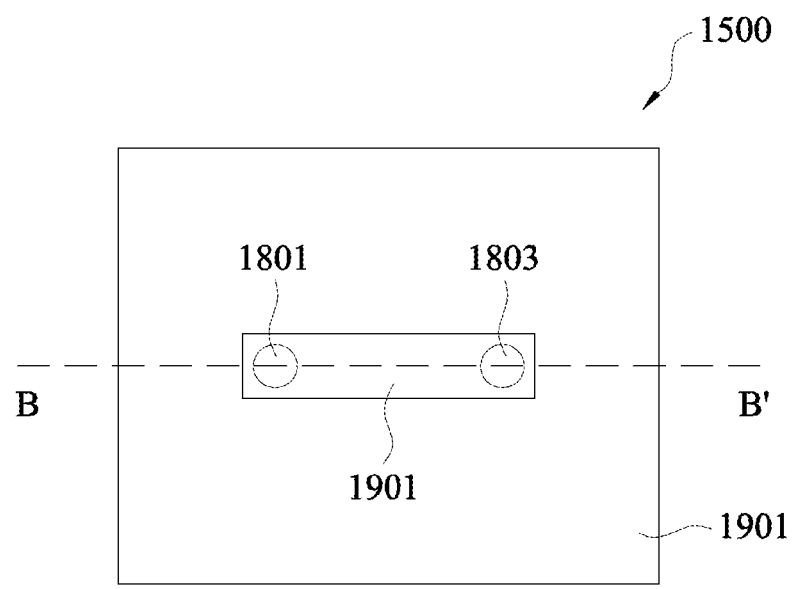
Figure 20B:
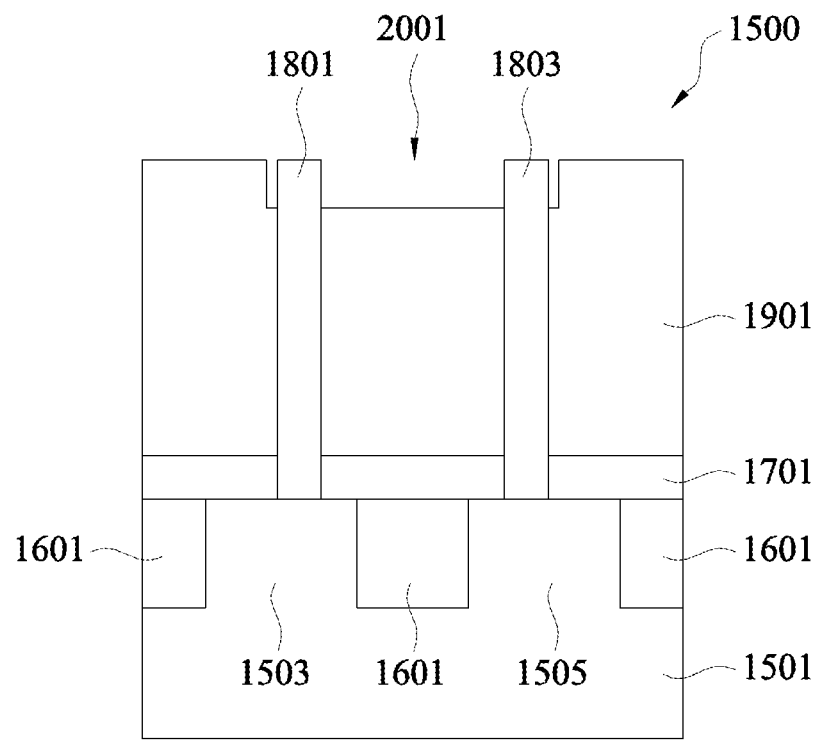

Referring to FIGS. 20A and 20B, an opening 2001 is formed in the dielectric layer 1901 to expose top portions of the first nanowire 1801 and the second nanowire 1803. In some embodiments, the opening 2001 may be formed using similar methods as the opening 801 (see FIGS. 8A and 8B) and the description is not repeated herein. As described below in greater detail, a third nanowire 2101 (see FIGS. 21A and 21B) is formed in the opening 2001. In some embodiments, the third nanowire 2101 acts as a horizontal portion of the channel of the semiconductor device 1500.

Figure 21A:
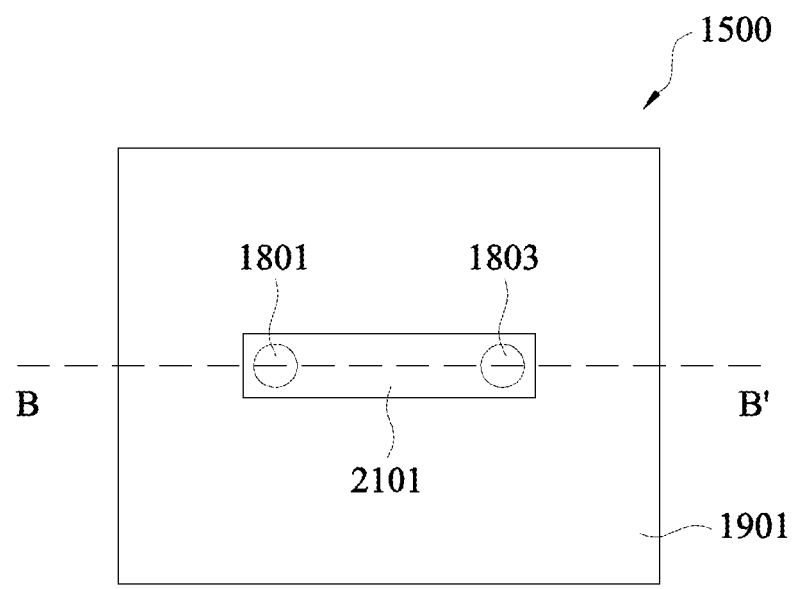
Figure 21B:
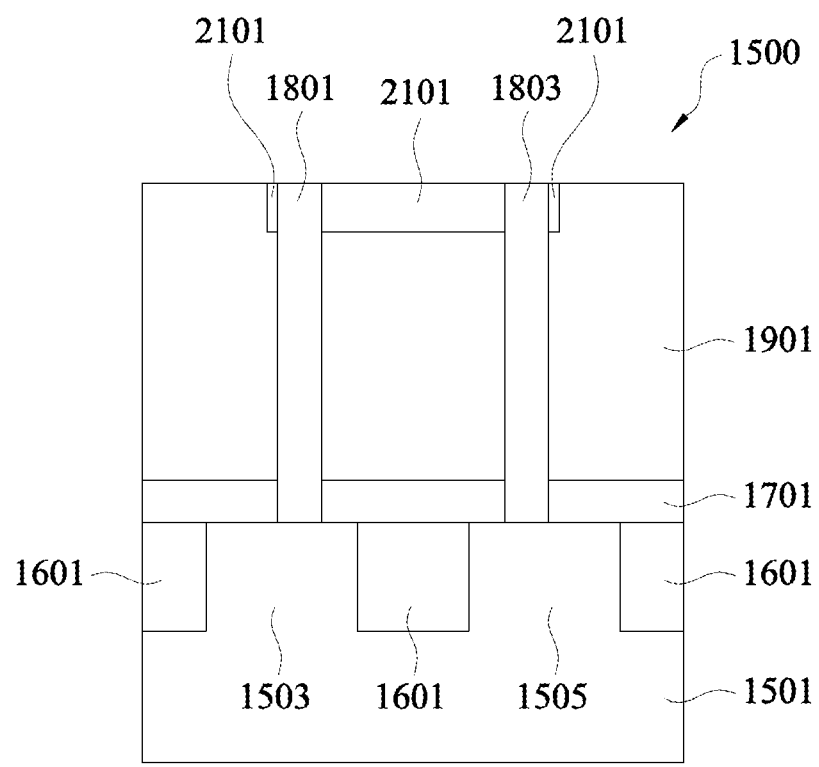

Referring to FIGS. 21A and 21B, the third nanowire 2101 is formed in the opening 2001. In some embodiments, the third nanowire 2101 forms the horizontal portion of the channel of the semiconductor device 1500. In the illustrated embodiment, the channel of the semiconductor device 1500 comprises the first nanowire 1801, the second nanowire 1803 and the third nanowire 2101. In some embodiments, the third nanowire 2101 may be formed using similar material and methods as the third nanowire 901 (see FIGS. 9A and 9B) and the description is not repeated herein. In some embodiments, the first nanowire 1801, the second nanowire 1803 and the third nanowire 2101 may comprise a same material. In other embodiments, the first nanowire 1801, the second nanowire 1803 and the third nanowire 2101 may comprise different materials.

Figure 22A:
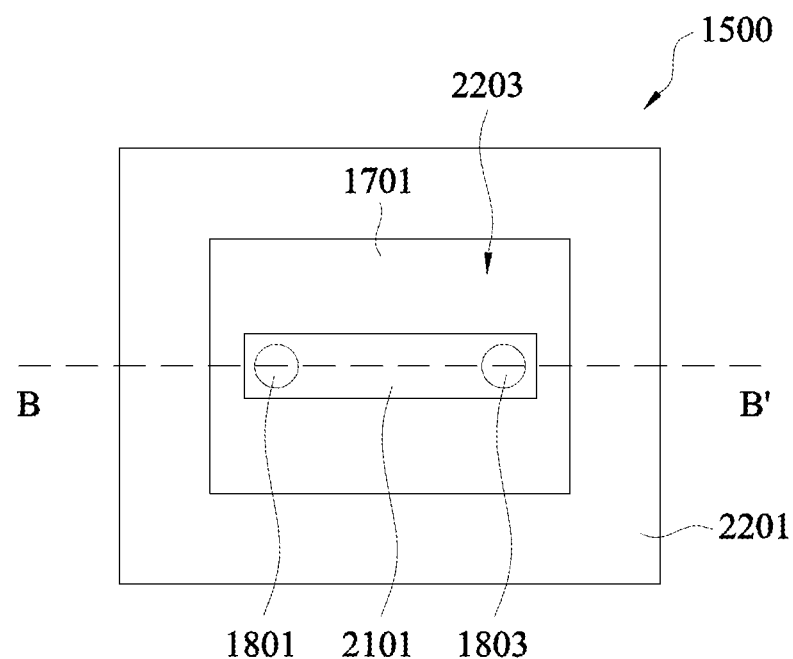
Figure 22B:
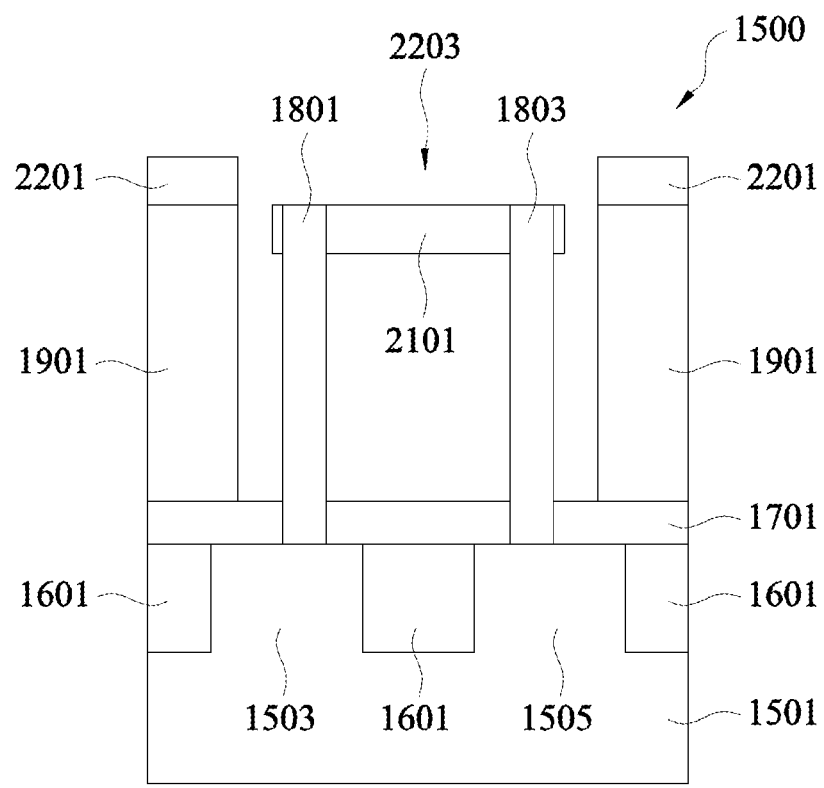

Referring to FIGS. 22A and 22B, a dielectric layer 2201 is formed over the dielectric layer 1901. In some embodiments, the dielectric layer 2201 may be formed using similar materials and methods as the dielectric layer 1001 (see FIGS. 10A and 10B) and the description is not repeated herein. In some embodiments, the dielectric layer 2201 and the dielectric layer 1901 may comprise a same material. In other embodiments, the dielectric layer 2201 and the dielectric layer 1901 may comprise different materials.

Referring further to FIGS. 22A and 22B, an opening 2203 is formed from a top surface of the dielectric layer 2201. In some embodiments, the opening 2203 extends through the dielectric layer 2201, the dielectric layer 1901 and exposes the template layer 1701. Moreover, the opening 2203 exposes sidewalls, top and bottom surfaces of the third nanowire 2101, and sidewalls and top surfaces of the first nanowire 1801 and the second nanowire 1803. In some embodiments, the dielectric layer 2201 and the dielectric layer 1901 may be patterned using suitable lithography and etching processes. In some embodiments, the dielectric layers 1901 and 2201 may have higher etch selectivities than the template layer 1701 and a selective etch process may be used to form the opening 2203. In some embodiments wherein the dielectric layer 2201 and the dielectric layer 1901 comprise a same material, the dielectric layer 2201 and the dielectric layer 1901 may be selectively etched using a single etch process. In other embodiments wherein the dielectric layer 2201 and the dielectric layer 1901 comprise different materials, the dielectric layer 2201 and the dielectric layer 1901 may be selectively etched using multiple etch process (for example, two etch processes). As described below in greater detail, a gate stack wrapping the first nanowire 1801, the second nanowire 1803 and the third nanowire 2101 is formed in the opening 2203.

Figure 23A:
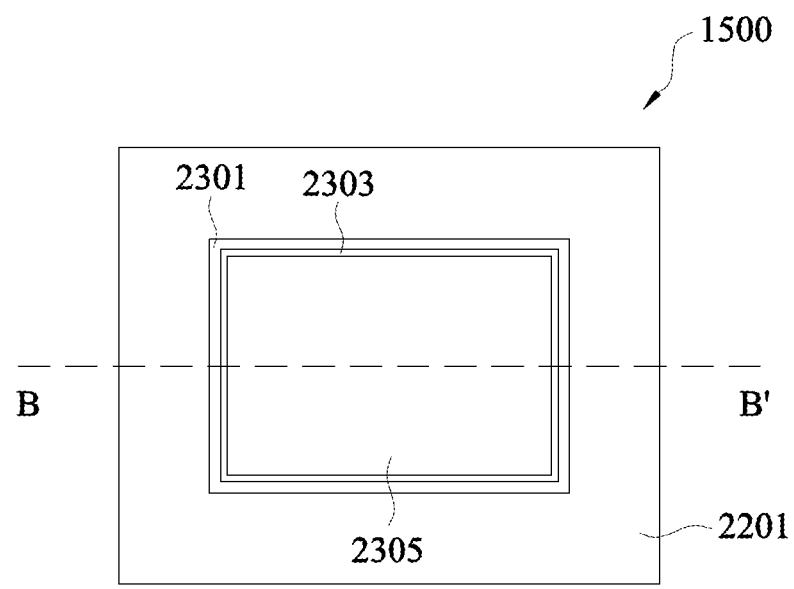
Figure 23B:
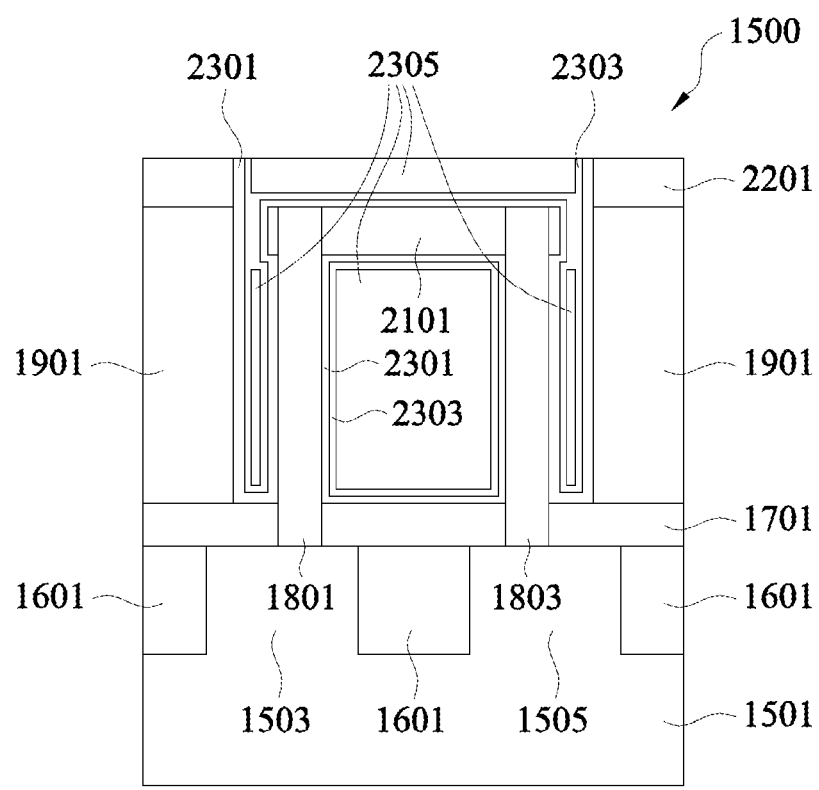

Referring to FIGS. 23A and 23B, a gate stack wrapping the channel (comprising the first nanowire 1801, the second nanowire 1803 and the third nanowire 2101) of the semiconductor device 1500 is formed in the opening 2203. In some embodiments, a gate dielectric layer 2301 is conformally formed in the opening 2203. In the illustrated embodiment, the gate dielectric layer 2301 covers sidewalls and a bottom of the opening 2203, and exposed surfaces of the first nanowire 1801, the second nanowire 11803 and the third nanowire 2101. In some embodiment, the gate dielectric layer 2301 may be formed using similar materials and methods as the gate dielectric layer 501 (see FIGS. 5A and 5B) and the description is not repeated herein. Subsequently, a work function layer 2303 is conformally formed in the opening 2203 adjacent the gate dielectric layer 2301. In some embodiment, the work function layer 2303 may be formed using similar materials and methods as the work function layer 503 (see FIGS. 5A and 5B) and the description is not repeated herein.

Referring further to FIGS. 23A and 23B, a gate electrode 2305 is formed on exposed surfaces of the work function layer 2303. In some embodiments, the gate dielectric layer 2301 and the work function layer 2303 do not completely fill the opening 2203, and the remaining portion of the opening 2203 may be filled by the gate electrode 2305. In some embodiments, the gate electrode 2305 may be formed using similar material and methods as the gate electrode 1105 (see FIGS. 11A and 11B) and the description is not repeated herein. Subsequently, portions of the gate dielectric layer 2301, the work function layer 2303 and the gate electrode 2305 extending over the dielectric layer 2201 may be removed such that top surfaces of the gate dielectric layer 2301, the work function layer 2303 and the gate electrode 2305 are substantially coplanar with the top surface of the dielectric layer 2201. In some embodiments, excess materials may be removed using, for example, an etching process, a grinding process, a CMP process, and the like.

Figure 24A:
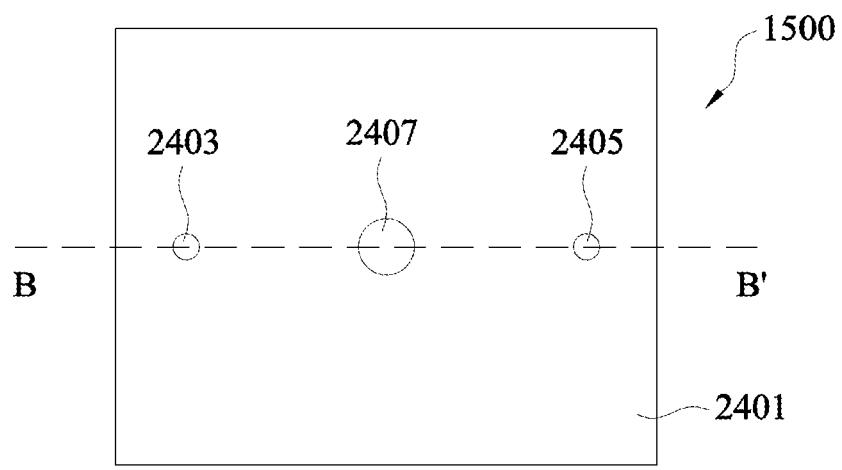
Figure 24B:
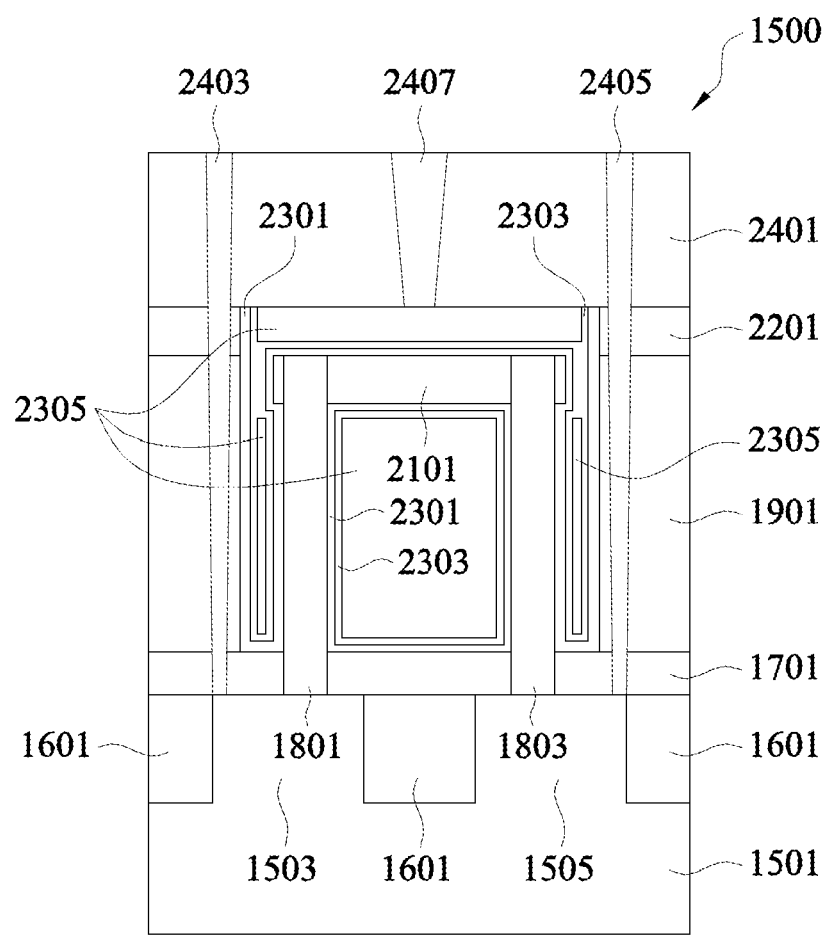

Referring to FIGS. 24A and 24B, an ILD layer 2401 is formed over the dielectric layer 2201. In some embodiments, the ILD layer 2401 may be formed using similar materials and methods as the ILD layer 1201 (see FIGS. 12A and 12B) and the description is not repeated herein. Subsequently, a first contact plug 2403, a second contact plug 2405, and a third contact plug 2407 are formed in the ILD layer 2401 to provide electrical connections to the first source/drain feature 1503, the second source/drain feature 1505 and the gate electrode 2305, respectively. In some embodiments, the first contact plug 2403, the second contact plug 2405, and the third contact plug 2407 may be formed using similar material and methods as the first contact plug 1301, the second contact plug 1303, and the third contact plug 1305 (see FIGS. 13A and 13B), respectively, and the description is not repeated herein. In the illustrated embodiment, the first contact plug 2403 extends through the ILD layer 2401, the dielectric layer 2201, the dielectric layer 1901, and the template layer 1701, and contacts the first source/drain feature 1503. The second contact plug 2405 extends through the ILD layer 2401, the dielectric layer 2201, the dielectric layer 1901, and the template layer 1701, and contacts the second source/drain feature 1505. The third contact plug 2407 extends through the ILD layer 2401 and contacts the gate electrode 2305.

In some embodiments, further manufacturing steps may be performed on the semiconductor device 1500. For example, metallization layers (not shown) may be formed over the ILD layer 2401. The metallization layers may comprise one or more dielectric layers, and one or more conductive features formed in the one or more dielectric layers. In some embodiments, the metallization layers are in electrical contact with the first contact plug 2403, the second contact plug 2405, and the third contact plug 2407, and electrically interconnect the semiconductor device 1500 to other devices formed on the substrate 1501. In some embodiments, the further manufacturing steps may also include formation of one or more redistribution layers (RDLs) over the metallization layers, formation of under-bump metallizations (UBMs) over the RLDs, and formation of connectors over the UBMs. Subsequently, the substrate 1501 may be singulated into separate dies, which may further undergo various packaging processes.

Figure 25:
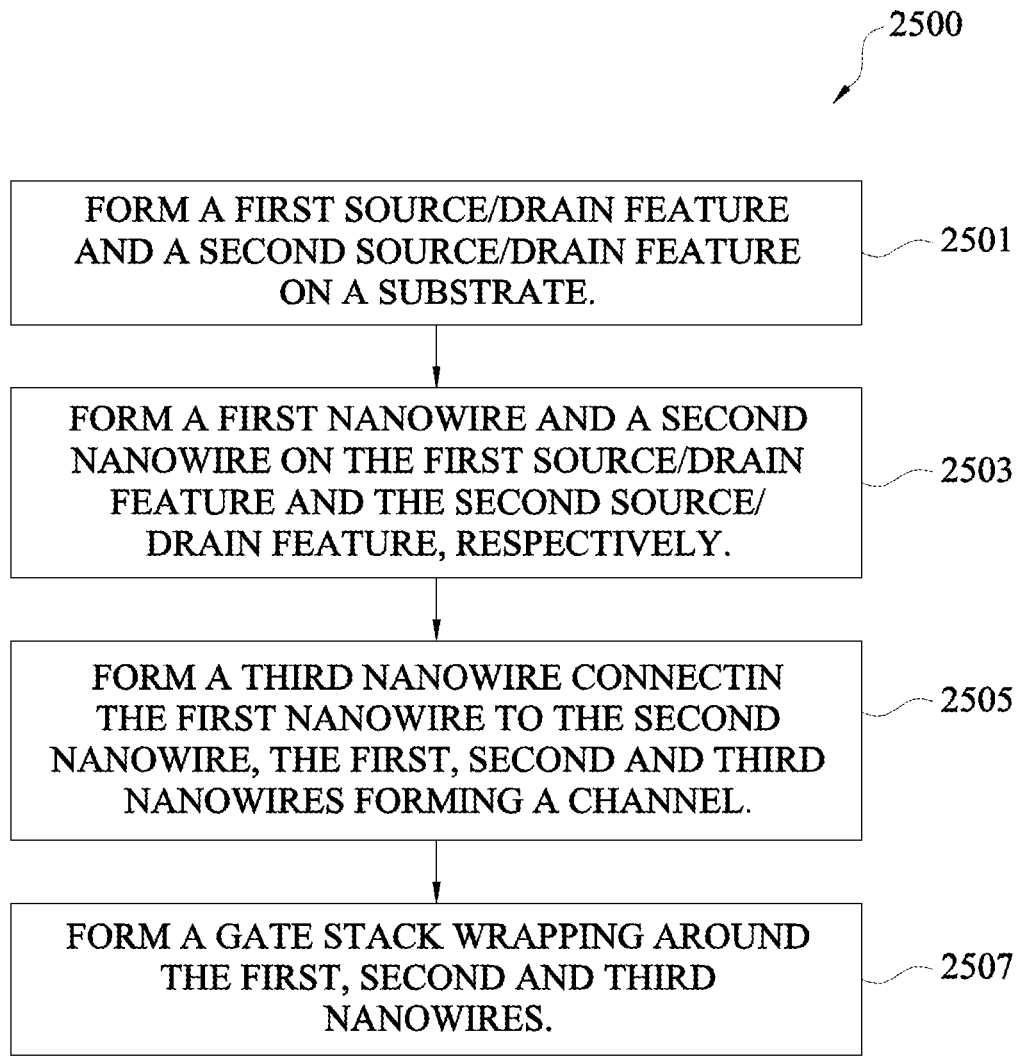
FIG. 25 is a flow diagram illustrating a method of forming a semiconductor device in accordance with some embodiments.

FIG. 25 is a flow diagram illustrating a method 2500 of forming the semiconductor device 1500 in accordance with some embodiments. The method 2500 starts with step 2501, wherein a first source/drain feature (such as first source/drain feature 1503) and a second source/drain feature (such as the second source/drain feature 1505) are formed on a substrate (such as the substrate 1501) as described above with reference to FIGS. 15A-16B. In step 2503, a first nanowire (such as the first nanowire 1801) and a second nanowire (such as the second nanowire 1803) are formed on the first source/drain feature and the second source/drain feature, respectively, as described above with reference to FIGS. 17A-18B. In some embodiments, the first nanowire and the second nanowire are substantially perpendicular to top surfaces of the first source/drain feature and the second source/drain feature. In step 2505, a third nanowire (such as the third nanowire 2101) connecting the first nanowire to the second nanowire is formed as described with reference to FIGS. 19A-21B. In some embodiments, the third nanowire is substantially parallel to the top surfaces of the first source/drain feature and the second source/drain feature. In some embodiments, the first nanowire, the second nanowire and the third nanowire form a channel of the semiconductor device 1500. In step 2507, a gate stack (such as the gate dielectric layer 2301, the work function layer 2303 and the gate electrode 2305) is formed wrapping around the first nanowire, the second nanowire and the third nanowire as described above with reference to FIGS. 22A-23B.

FIGS. 26A-33B illustrate various intermediate stages of fabrication of a semiconductor device 2600 in accordance with some embodiments. FIGS. 26A-33B illustrate top and cross-sectional views, wherein an "A" figure represents a top view and a "B" figure represents a cross-sectional view along the B-B' line of the respective "A" figure. In addition, various elements of FIGS. 26A-33A are depicted using dashed lines to indicate that such elements are not visible in the top views illustrated in FIGS. 26A-33A. As described above with reference to FIGS. 1A-13B, the channel of the semiconductor device 100 comprises epitaxially grown nanowires (such as the first nanowire 401 and the second nanowire 403). As described below in greater detail, a channel of the semiconductor device 2600 comprises nanowires that are formed using lithography and etching processes.

Figure 26A:
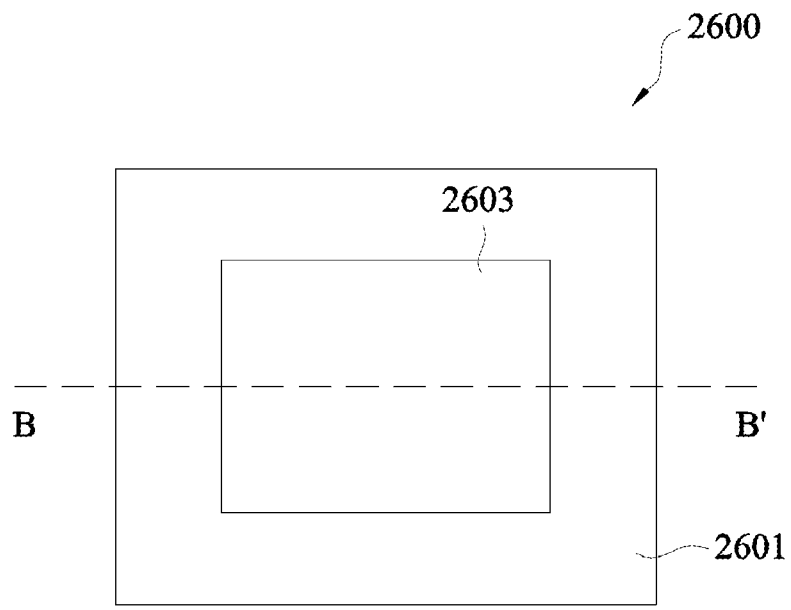
FIGS. 26A-33B illustrate various top and cross-sectional views of a fabrication process of a semiconductor device in accordance with some embodiments.
Figure 26B:
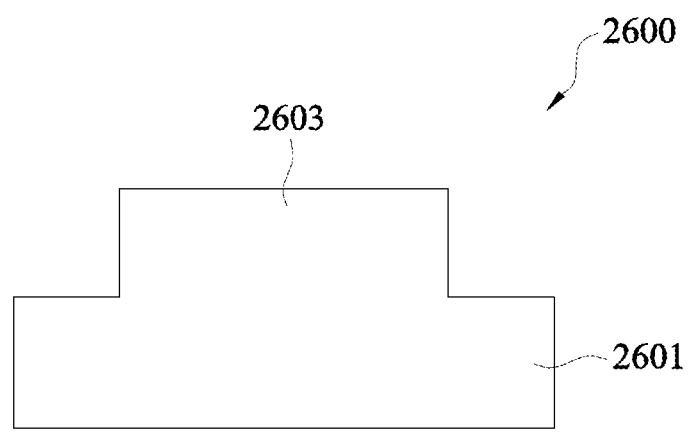

Referring first to FIGS. 26A and 26B, a portion of a substrate 2601 having a feature 2603 formed thereon is illustrated. The substrate 2601 may be formed of similar materials as the substrate 101 (see FIGS. 1A and 1B) and the description is not repeated herein. In some embodiments, the substrate 2601 is patterned to form the feature 2603. In some embodiments, the feature 2603 may be formed using similar methods as the first feature 103 and the second feature 105 (see FIGS. 1A and 1B), respectively, and the description is not repeated herein.

Figure 27A:
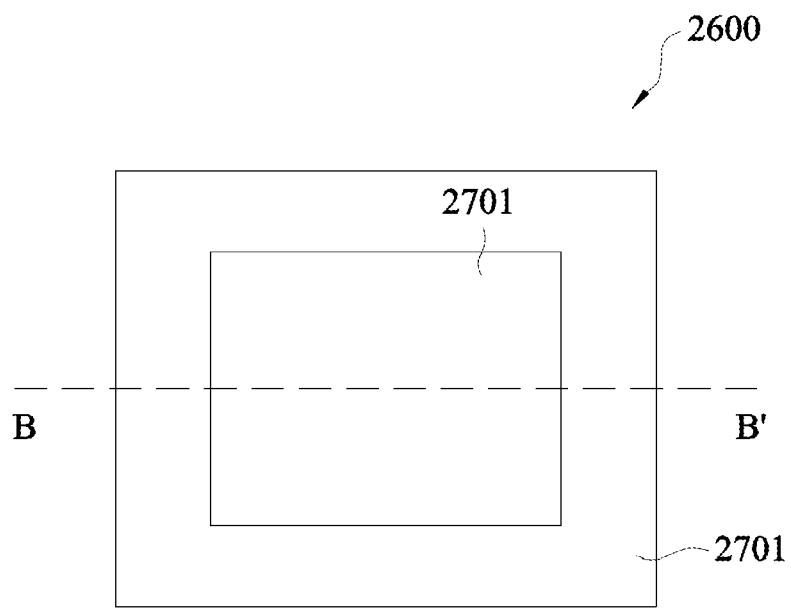
Figure 27B:
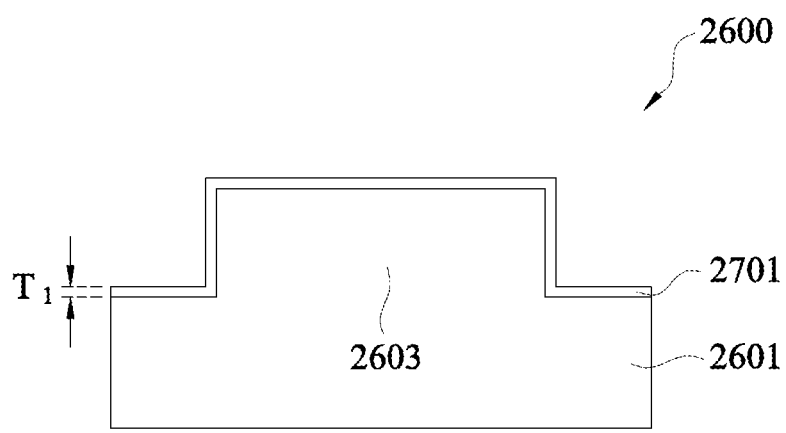

Referring to FIGS. 27A and 27B, a semiconductor layer 2701 is formed over the substrate 2601 and the feature 2603. In some embodiments, the semiconductor layer 2701 may comprise similar candidate materials as the substrate 2601 and may be formed using, for example, CVD, LPCVD, ALD, and like. In the illustrated embodiment, the semiconductor layer 2701 and the substrate 2601 comprise different materials having different etch selectivities. As described below in greater detail, the difference between the etch selectivities allows for selective removal of a portion of the substrate 2601. In some embodiments wherein the semiconductor layer 2701 comprises SiGe, the semiconductor layer 2701 may be formed using, for example, LPCVD using $SiH_4$ and $GeH_4$ as precursor gases. In some embodiments, the semiconductor layer 2701 has a thickness $T_1$ between about 2 nm and about 200 nm.

As described below in greater detail, the semiconductor layer 2701 is patterned to form a plurality of channels and source/drain features of the semiconductor device 2600. Moreover, lengths of the channels are determined by dimensions such as a height and a width of the feature 2603. By forming a plurality of features (such as the feature 2603) having different dimensions on a substrate (such as the substrate 2601), it is then possible form semiconductor devices (such the semiconductor device 2600) having different channel lengths. Furthermore, the features of different widths may be formed on the substrate using a single patterning process, which advantageously allows for determining channel lengths using the single patterning process.

Figure 28A:
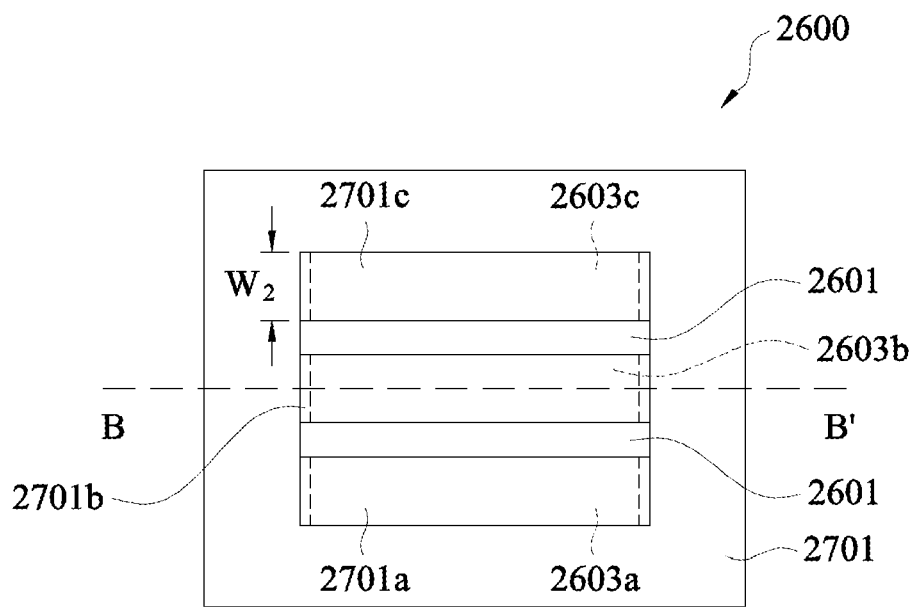
Figure 28B:
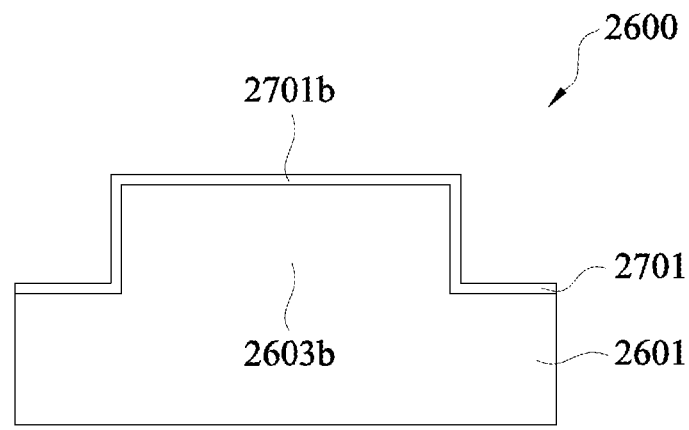

Referring to FIGS. 28A and 28B, the feature 2603 and the semiconductor layer 2701 are patterned to form fins 2603a, 2603b and 2603c, and corresponding semiconductor shells 2701a, 2701b and 2701c. In the illustrated embodiment, the semiconductor shells 2701a, 2701b and 2701c are disposed on sidewalls and top surfaces of the fins 2603a, 2603b and 2603c, respectively. In some embodiments, the feature 2603 and the semiconductor layer 2701 may be patterned using suitable lithography and etching processes. In the illustrated embodiments, three fins (such as the fins 2603a, 2603b and 2603c) and the three semiconductor shells (such as the semiconductor shells 2701a, 2701b and 2701c) are formed on the substrate 2601. However, in other embodiments, a number of the fins and the semiconductor shells may be less or more than three based on design requirements for the semiconductor device 2600. In some embodiments, the semiconductor shells 2701a, 2701b and 2701c have shapes of nanowires and may be also referred to as nanowires 2701a, 2701b and 2701c. As described below in greater detail, the semiconductor shells 2701a, 2701b and 2701c act as channels of the semiconductor device 2600. Accordingly, the semiconductor shells 2701a, 2701b and 2701c may be also referred to as channels 2701a, 2701b and 2701c. In some embodiment, the channels 2701a, 2701b and 2701c have a width $W_2$ between about 2 nm and about 50 nm.

Figure 29A:
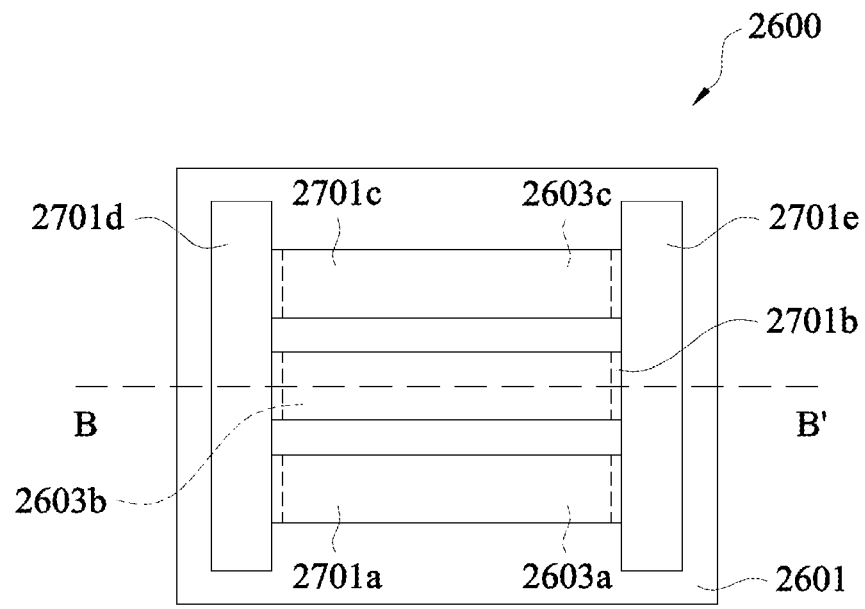
Figure 29B:
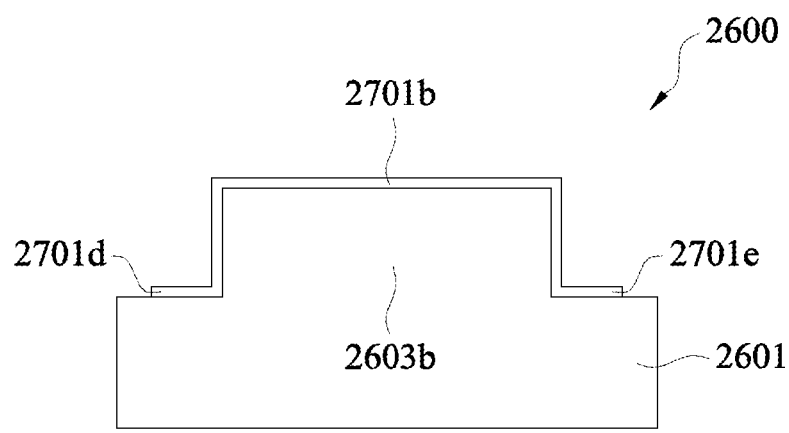

Referring to FIGS. 29A and 29B, portions of the semiconductor layer 2701 on a top surface of the substrate 2601 are patterned to form a first source/drain feature 2701d and a second source/drain feature 2701e. In some embodiments, the portions of the semiconductor layer 2701 on the top surface of the substrate 2601 may be patterned using suitable lithography and etching processes. In the illustrated embodiment, the first source/drain feature 2701*d* and the second source/drain feature 2701*e* act as common source/drain features for the channels 2701*a*, 2701*b* and 2701*c*.

Figure 30A:
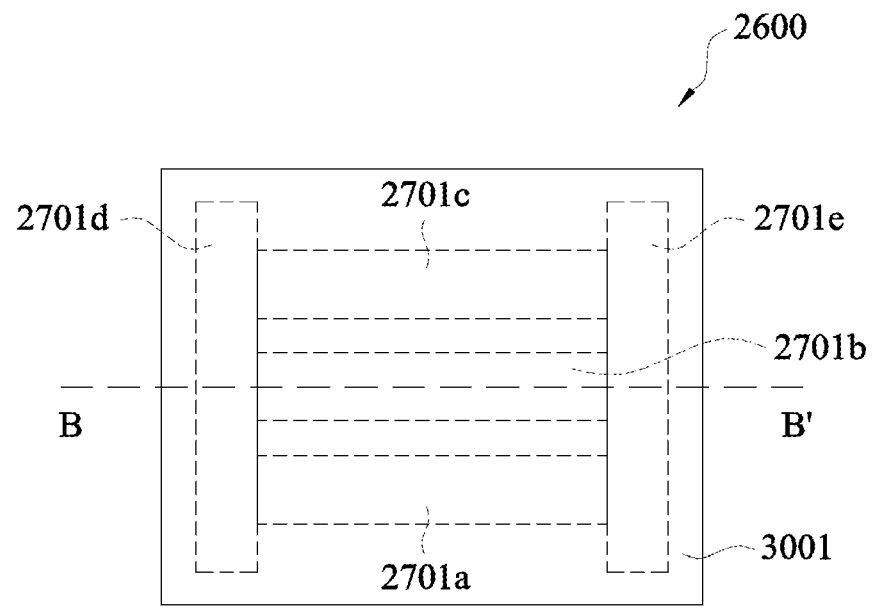
Figure 30B:
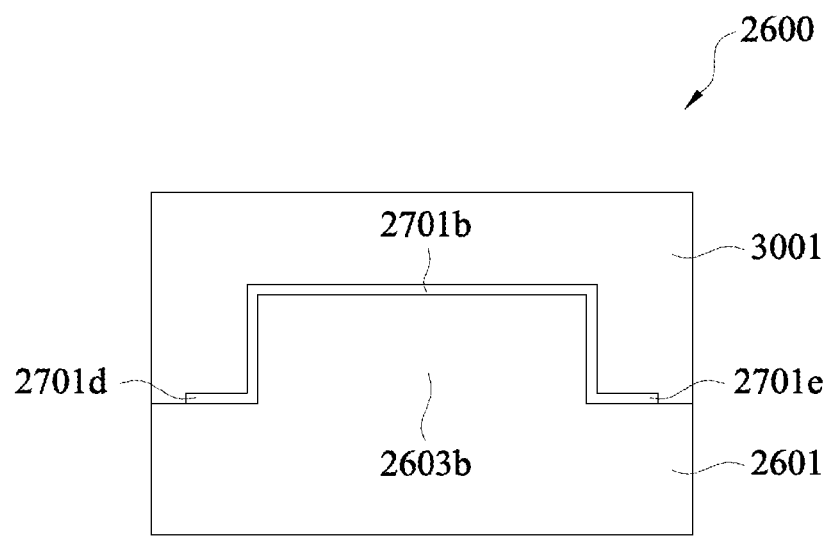

Referring to FIGS. 30A and 30B, a dielectric layer 3001 is formed over the substrate 2601, the channels 2701*a*, 2701*b* and 2701*c*, the first source/drain feature 2701*d* and the second source/drain feature 2701*e*. In some embodiments, the dielectric layer 3001 may be formed using similar materials and methods as the dielectric layer 701 (see FIGS. 7A and 7B) and the description is not repeated herein.

Figure 31A:
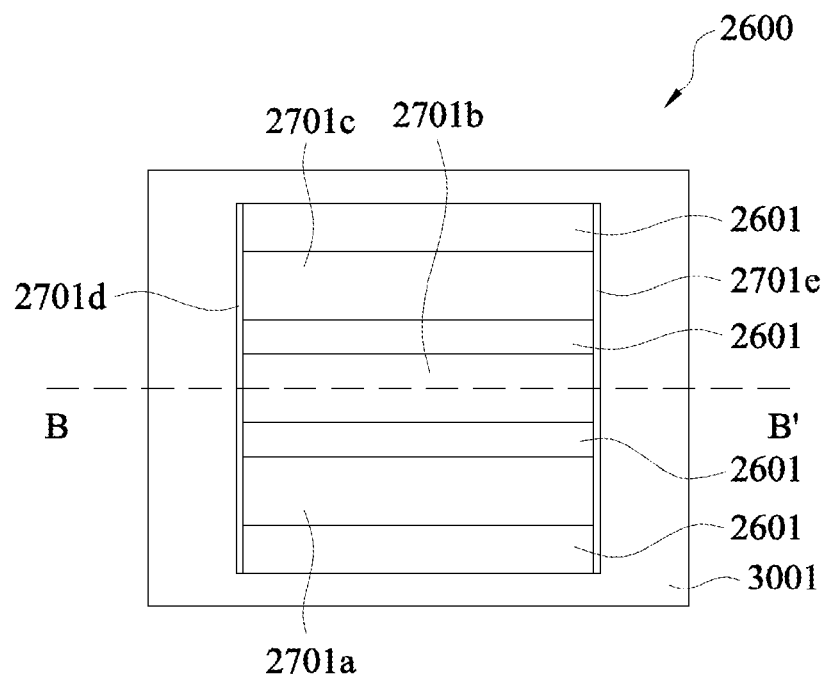
Figure 31B:
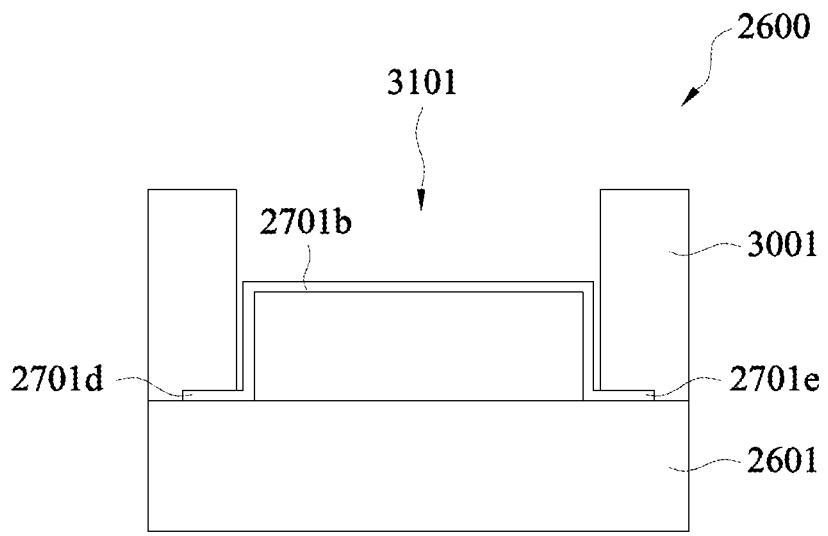

Referring to FIGS. 31A and 31B, the dielectric layer 3001 is patterned to form an opening 3101 in the dielectric layer 3001. In some embodiments, the dielectric layer 3001 may be patterned using suitable lithography and etching processes. In the illustrated embodiment, the opening 3101 exposes the channels 2701*a*, 2701*b* and 2701*c* and the fins 2603*a*, 2603*b* and 2603*c*. Subsequently, the fins 2603*a*, 2603*b* and 2603*c* are selectively removed such that only the channels 2701*a*, 2701*b* and 2701*c* remain in the opening 3101. In some embodiments wherein the fins 2603*a*, 2603*b* and 2603*c* comprise silicon, the fins 2603*a*, 2603*b* and 2603*c* may be selectively removed using a wet etch process with etchants such as, for example, tetramethylammonium hydroxide (TMAH), potassium hydroxide (KOH), and the like.

Figure 32A:
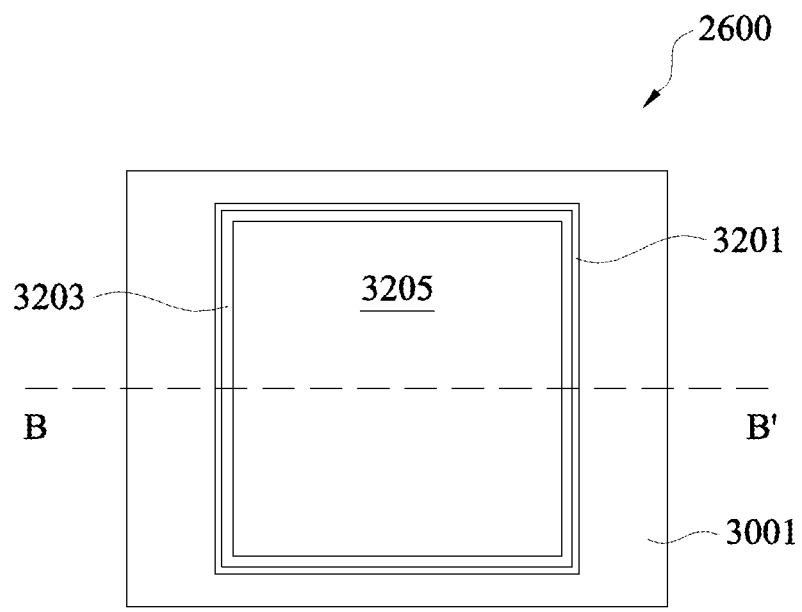
Figure 32B:
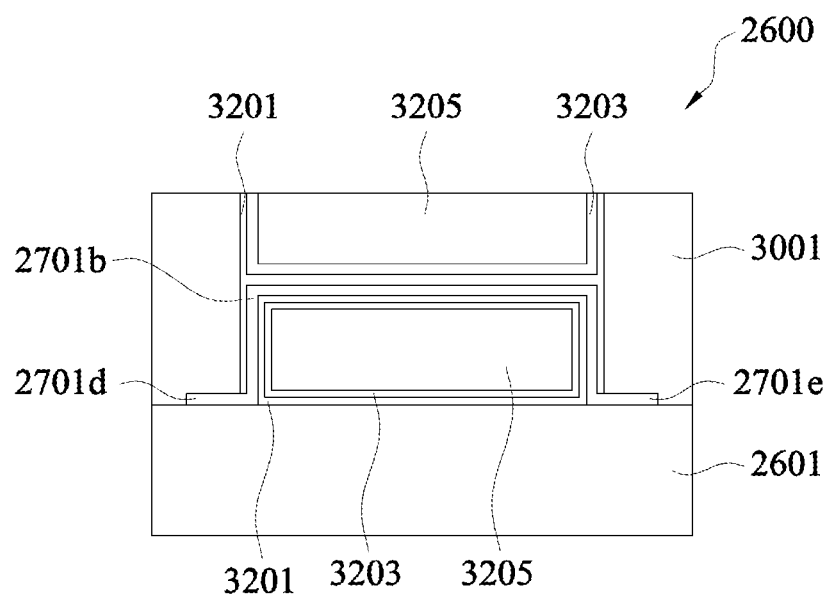

Referring to FIGS. 32A and 32B, a gate stack is formed in the opening 3101 and wrapping around the channels 2701*a*, 2701*b* and 2701*c*. In some embodiments, a gate dielectric layer 3201 is conformally formed in the opening 3101. In the illustrated embodiment, the gate dielectric layer 3201 covers sidewalls and a bottom of the opening 3101, and exposed surfaces of the channels 2701*a*, 2701*b* and 2701*c*. In some embodiment, the gate dielectric layer 3201 may be formed using similar materials and methods as the gate dielectric layer 501 (see FIGS. 5A and 5B) and the description is not repeated herein. Subsequently, a work function layer 3203 is conformally formed in the opening 3101 adjacent the gate dielectric layer 3201. In some embodiment, the work function layer 3203 may be formed using similar materials and methods as the work function layer 503 (see FIGS. 5A and 5B) and the description is not repeated herein.

Referring further to FIGS. 32A and 32B, a gate electrode 3205 is formed on exposed surfaces of the work function layer 3203. In some embodiments, the gate dielectric layer 3201 and the work function layer 3203 do not completely fill the opening 3101, and the remaining portion of the opening 3101 may be filled by the gate electrode 3205. In some embodiments, the gate electrode 3205 may be formed using similar material and methods as the gate electrode 1105 (see FIGS. 11A and 11B) and the description is not repeated herein. Subsequently, portions of the gate dielectric layer 3201, the work function layer 3203 and the gate electrode 3205 extending over the dielectric layer 3001 may be removed such that top surfaces of the gate dielectric layer 3201, the work function layer 3203 and the gate electrode 3205 are substantially coplanar with the top surface of the dielectric layer 3001. In some embodiments, excess materials may be removed using, for example, an etching process, a grinding process, a CMP process, or the like.

Figure 33A:
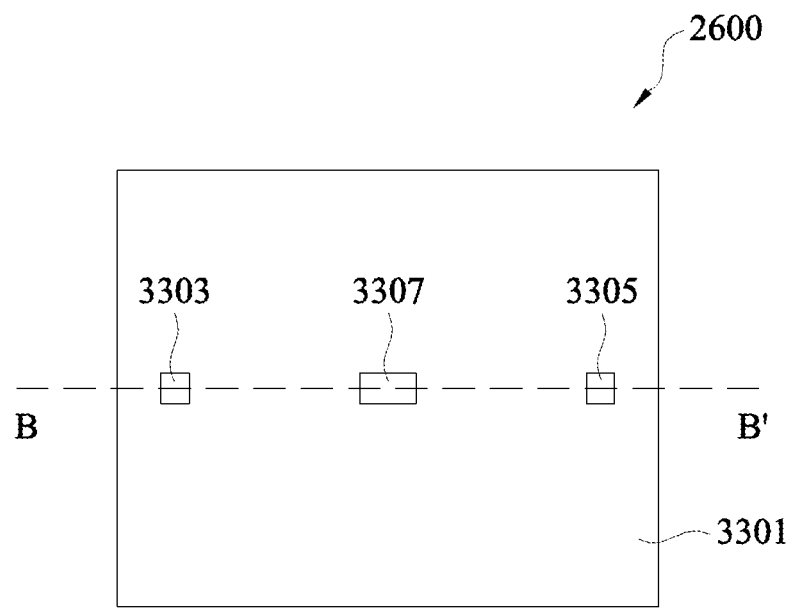
Figure 33B:
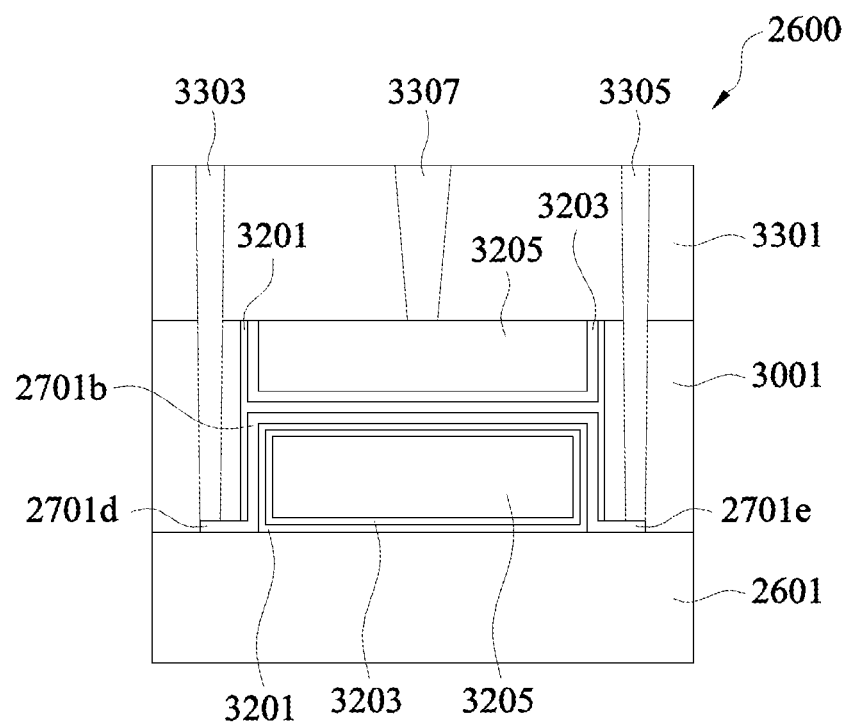

Referring to FIGS. 33A and 33B, an ILD layer 3301 is formed over the dielectric layer 3001. In some embodiments, the ILD layer 3301 may be formed using similar materials and methods as the ILD layer 1201 (see FIGS. 12A and 12B) and the description is not repeated herein. Subsequently, a first contact plug 3303, a second contact plug 3305, and a third contact plug 3307 are formed in the ILD layer 3301 to provide electrical connections to the first source/drain feature 2701*d*, the second source/drain feature 2701*e* and the gate electrode 3105, respectively. In some embodiments, the first contact plug 3303, the second contact plug 3305, and the third contact plug 3307 may be formed using similar material and methods as the first contact plug 1301, the second contact plug 1303, and the third contact plug 1305 (see FIGS. 13A and 13B), respectively, and the description is not repeated herein. In the illustrated embodiment, the first contact plug 3303 extends through the ILD layer 3301, the dielectric layer 3001 and contacts the first source/drain feature 2701*d*. The second contact plug 3305 extends through the ILD layer 3301, the dielectric layer 3001 and contacts the second source/drain feature 2701*e*. The third contact plug 3307 extends through the ILD layer 3301 and contacts the gate electrode 3105. In the illustrated embodiment, top-view shapes of the first contact plug 3303, the second contact plug 3305, and the third contact plug 3307 are rectangular shapes. However, in other embodiments, the top-view shapes of the first contact plug 3303, the second contact plug 3305, and the third contact plug 3307 may be circles, polygons such as triangles, hexagons, and the like.

In some embodiments, further manufacturing steps may be performed on the semiconductor device 2600. For example, metallization layers (not shown) may be formed over the ILD layer 3301. The metallization layers may comprise one or more dielectric layers, and one or more conductive features formed in the one or more dielectric layers. In some embodiments, the metallization layers are in electrical contact with the first contact plug 3303, the second contact plug 3305, and the third contact plug 3307, and electrically interconnect the semiconductor device 2600 to other devices formed on the substrate 2601. In some embodiments, the further manufacturing steps may also include formation of one or more redistribution layers (RDLs) over the metallization layers, formation of under-bump metallizations (UBMs) over the RLDs, and formation of connectors over the UBMs. Subsequently, the substrate 2601 may be singulated into separate dies, which may further undergo various packaging processes.

Figure 34:
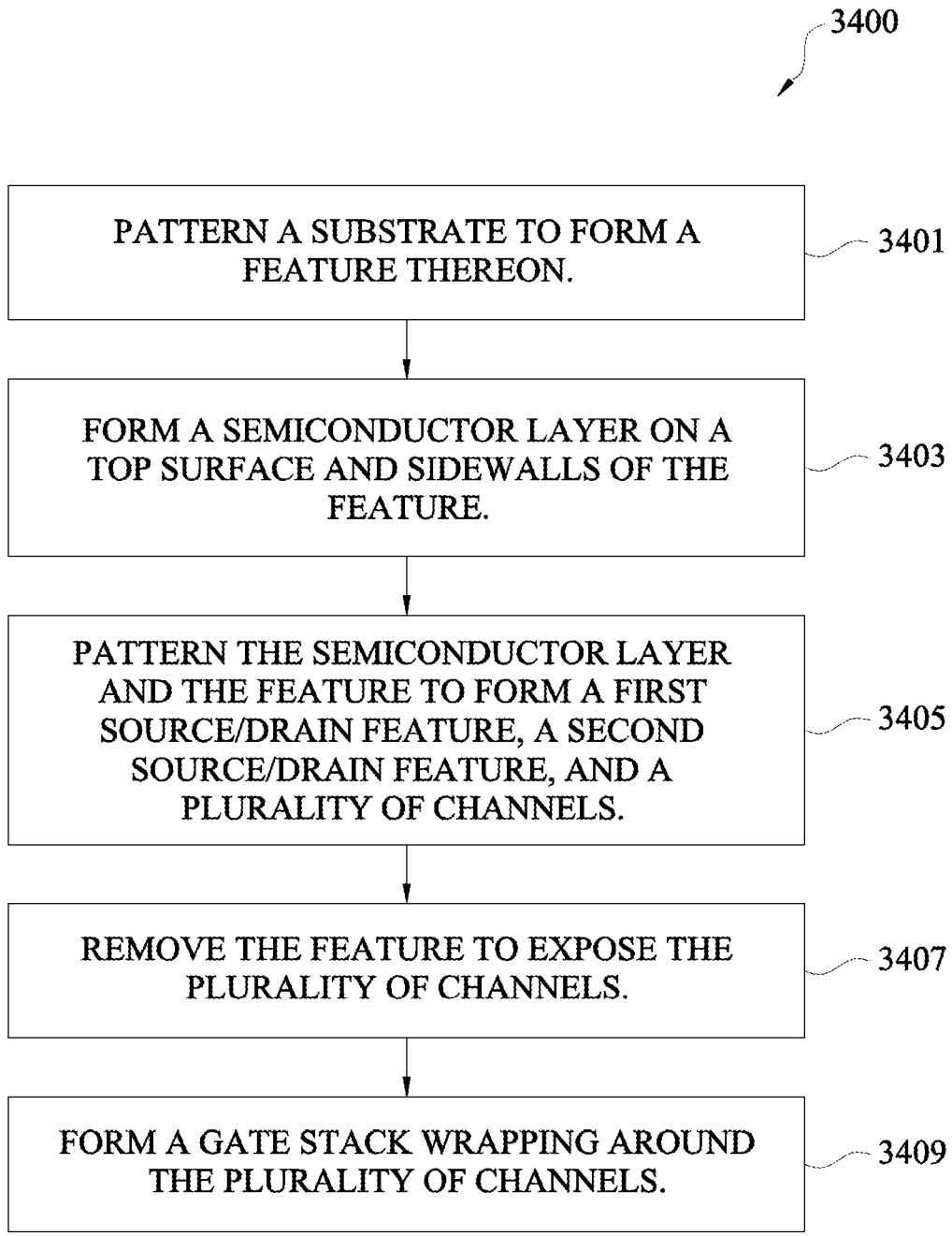
FIG. 34 is a flow diagram illustrating a method of forming a semiconductor device in accordance with some embodiments.

FIG. 34 is a flow diagram illustrating a method 3400 of forming the semiconductor device 2600 in accordance with some embodiments. The method 3400 starts with step 3401, wherein a feature (such as the feature 2603) is formed on a substrate (such as the substrate) as described above with reference to FIGS. 26A and 26B. In step 3403, a semiconductor layer (such as the semiconductor layer 2701) is formed on a top surface and sidewalls of the feature as described above with reference to FIGS. 27A and 27B. In step 3405, the semiconductor layer is patterned to form a first source/drain feature (such as the first source/drain feature 2701*d*), a second source/drain feature (such as the second source/drain feature 2701*e*) and a plurality of channels (such as the channels 2701*a*, 2701*b* and 2701*c*) extending from the first source/drain feature to the second source/drain feature as described above with reference to FIGS. 28A-29B. In step 3407, the feature is removed to expose the plurality of channels as described above with reference to FIGS. 30A-31B. In step 3409, a gate stack (such as the gate dielectric layer 3201, the work function layer 3203 and the gate electrode 3205) is formed wrapping around the plurality of channels as described above with reference to FIGS. 32A-32B.

FIGS. 35A-42B illustrate various intermediate stages of fabrication of a semiconductor device 3500 in accordance with some embodiments. FIGS. 35A-42B illustrate top and cross-sectional views, wherein an "A" figure represents a top view and a "B" figure represents a cross-sectional view along the B-B' line of the respective "A" figure. In addition, various elements of FIGS. 35A-42A are depicted using dashed lines to indicate that such elements are not visible in the top views illustrated in FIGS. 35A-42A. As described above with reference to FIGS. 1A-13B, the channel of the semiconductor device 100 comprises the first nanowire 401 and the second nanowire 403 extending vertically from the uppermost surfaces of the first source/drain feature 103 and the second source/drain feature 105, respectively, and the third nanowire 901 connecting top portions of the first nanowire 401 and the second nanowire 403. As described below in greater detail, a channel of the semiconductor device 2600 comprises a fin formed on a substrate, and nanowires extending vertically from opposite ends of the fin.

Figure 35A:
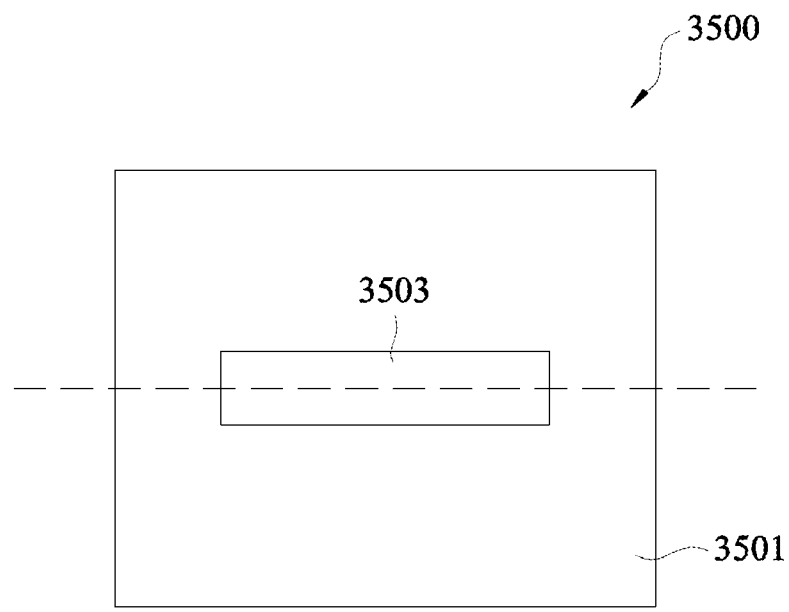
FIGS. 35A-42B illustrate various top and cross-sectional views of a fabrication process of a semiconductor device in accordance with some embodiments.
Figure 35B:
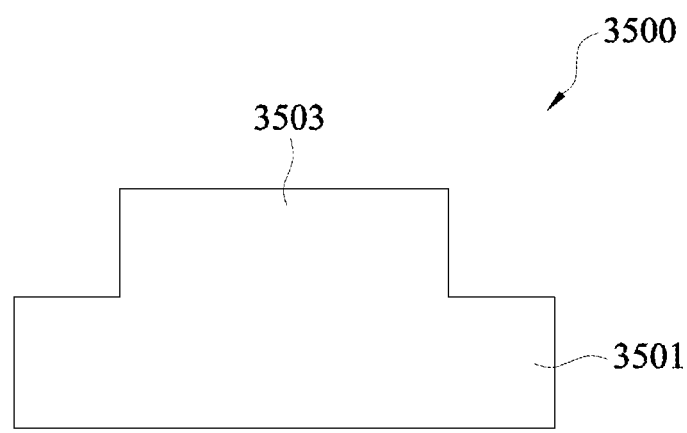

Referring first to FIGS. 35A and 35B, a portion of a substrate 3501 having a fin 3503 formed thereon is illustrated. The substrate 3501 may be formed of similar materials as the substrate 101 (see FIGS. 1A and 1B) and the description is not repeated herein. In some embodiments, the substrate 3501 is patterned to form the fin 3503. In some embodiments, the fin 3503 may be formed using similar methods as the first feature 103 and the second feature 105 (see FIGS. 1A and 1B) and the description is not repeated herein.

As described below in greater detail, the fin 3503 acts as a horizontal portion of a channel of the semiconductor device 3500. Accordingly, a length of the channel depends on a length of the fin 3503. By forming a plurality of fins (such as the fin 3503) having different lengths on a substrate (such as the substrate 3501), it is then possible to form semiconductor devices (such as the semiconductor devices 3500) having different channel lengths. Furthermore, the fins of different lengths may be formed on the substrate using a single patterning process, which advantageously allows for determining channel lengths using the single patterning process.

Figure 36A:
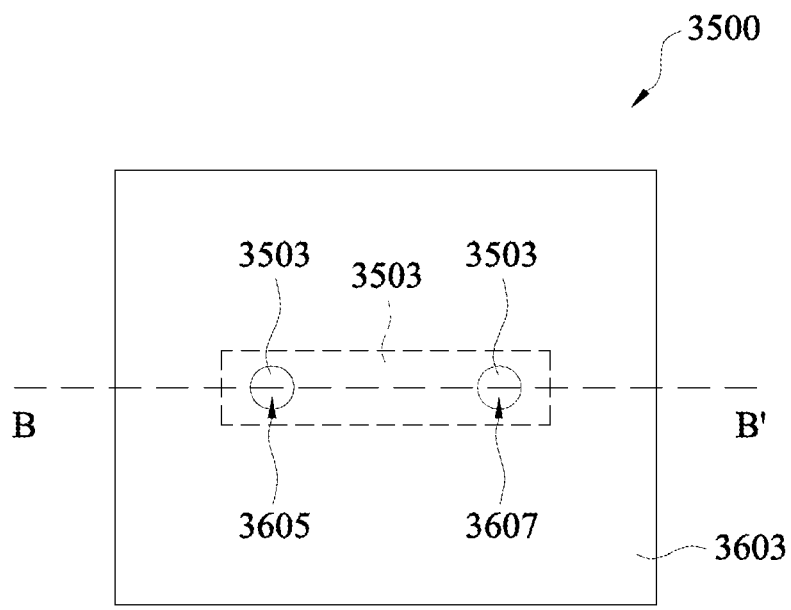
Figure 36B:
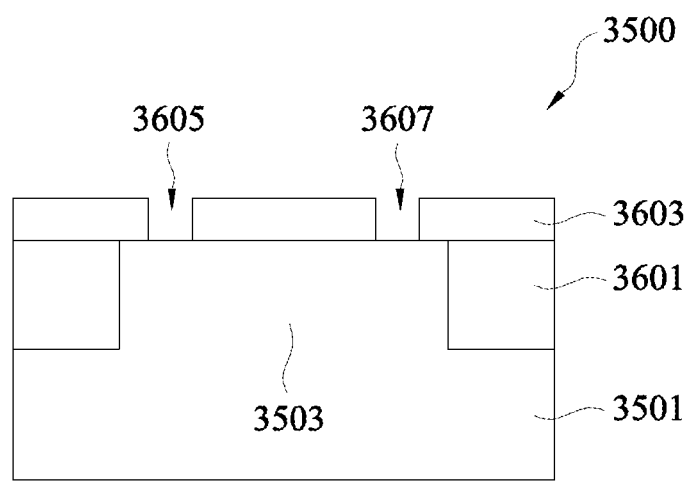

Referring to FIGS. 36A and 36B, an STI structure 3601 is formed over the substrate 3501 and on sidewalls of the fin 3503. In some embodiments, the STI structure 3601 may be formed using similar material and methods as the STI structure 201 (see FIGS. 2A and 2B) and the description is not repeated herein. Subsequently, a template layer 3603 is formed over the STI structure 3601 and the fin 3503. In some embodiments, the template layer 3603 may be formed using similar materials and methods as the template layer 301 (see FIGS. 3A and 3B) and the description is not repeated herein.

Referring further to FIGS. 36A and 36B, the template layer 3603 is patterned form a first opening 3605 and a second opening 3607 therein. In some embodiments, the first opening 3605 and the second opening 3607 expose respective ends of the fin 3503. In some embodiments, the first opening 3605 and the second opening 3607 may be formed using similar methods as the first opening 303 and the second opening 305 (see FIGS. 3A and 3B) and the description is not repeated herein.

Figure 37A:
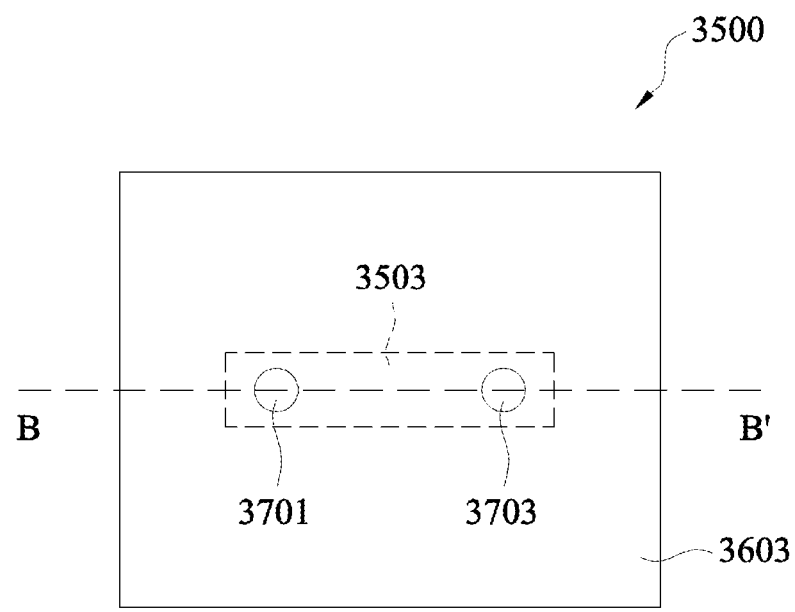
Figure 37B:
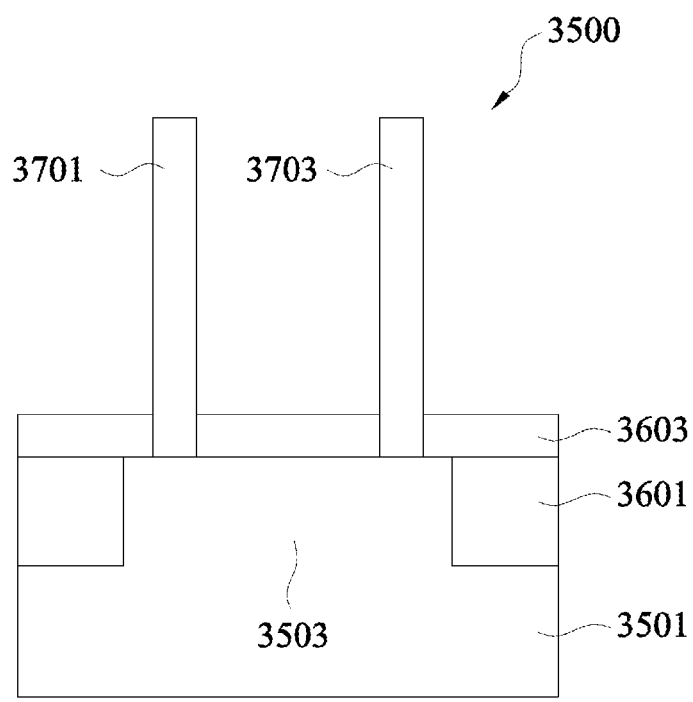

Referring to FIGS. 37A and 37B, a first nanowire 3701 and a second nanowire 3703 are formed in the first opening 3605 and the second opening 3607 (see FIGS. 36A and 36B), respectively. As described below in greater detail, the first nanowire 3701 and the second nanowire 3703 form vertical portions of the channel of the semiconductor device 3500. In some embodiments, the first nanowires 3701 and the second nanowires 3703 may be formed using similar material and methods as the first nanowire 401 and the second nanowire 403 (see FIGS. 4A and 4B) and the description is not repeated herein. In the illustrated embodiment, the fin 3503, the first nanowire 3701 and the second nanowire 3703 form the channel of the semiconductor device 3500.

Figure 38A:
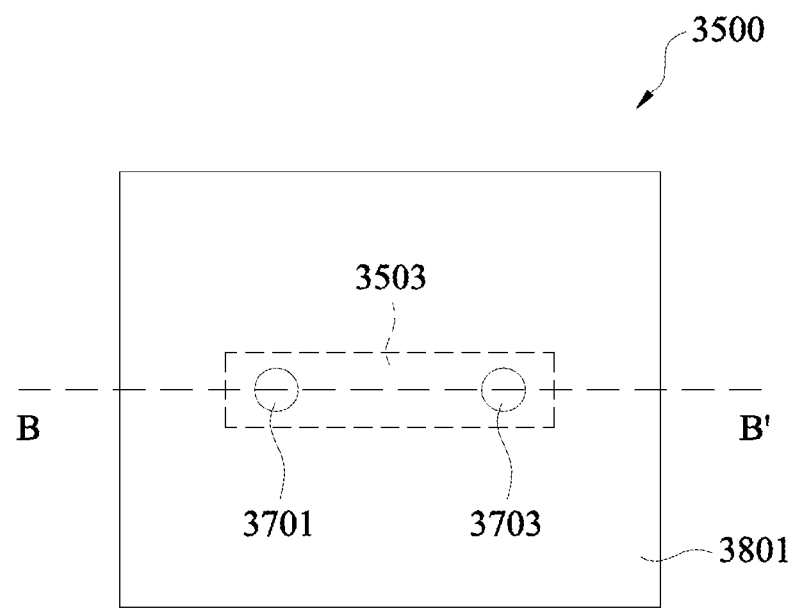
Figure 38B:
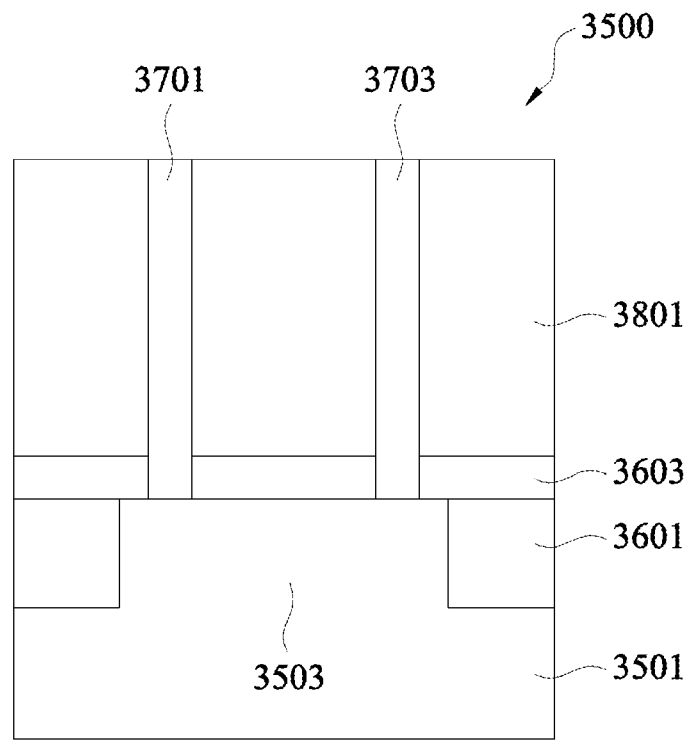

Referring to FIGS. 38A and 38B, a dielectric layer 3801 is formed over the template layer 3603 and surrounding the first nanowire 3701 and the second nanowire 3703. In some embodiments, the dielectric layer 3801 may be formed using similar materials and methods as the dielectric layer 701 (see FIGS. 7A and 7B) and the description is not repeated herein.

Figure 39A:
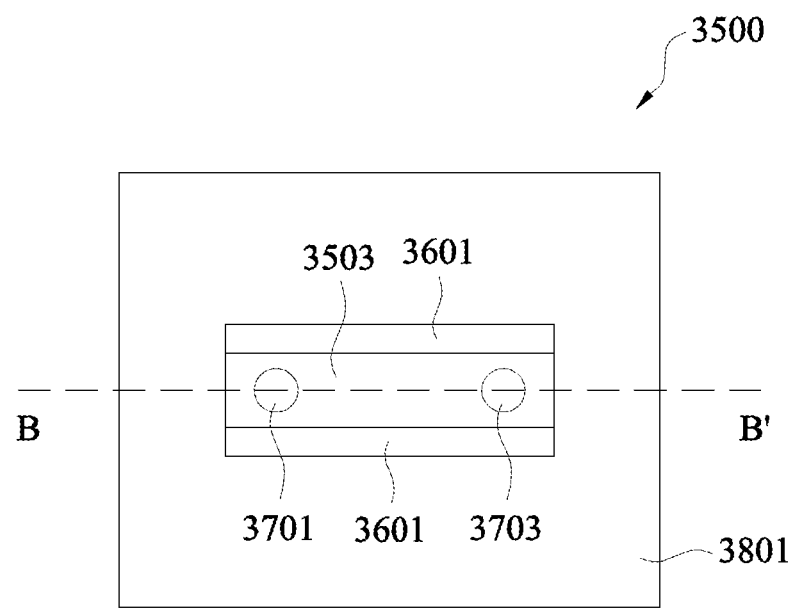
Figure 39B:
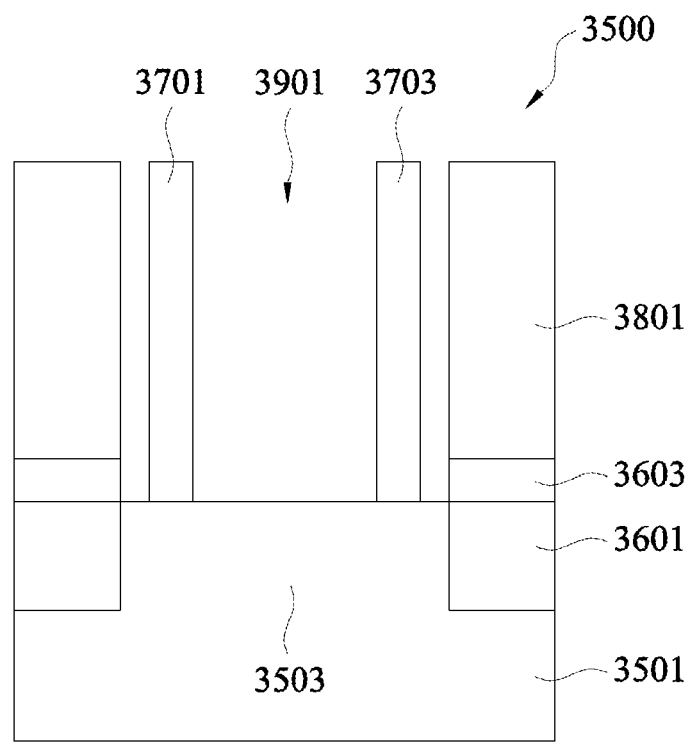

Referring to FIGS. 39A and 39B, the dielectric layer 3801, the template layer 3603 and the STI structure 3601 are recessed to form an opening 3901. In some embodiments, the opening 3901 may be formed using suitable lithography and etching processes. In the illustrated embodiment, the opening 3901 exposes a top surface and sidewalls of the fin 3503, and top surfaces and sidewalls of the first nanowire 3701 and the second nanowire 3703. In some embodiments, the dielectric layer 3801, the template layer 3603 and the STI structure 3601 may have higher etch selectivities than the fin 3503 and a selective etch process may be used to form the opening 3901. As described below in greater detail, a gate stack wrapping the channel of the semiconductor device 3500 is formed in the opening 3901.

Figure 40A:
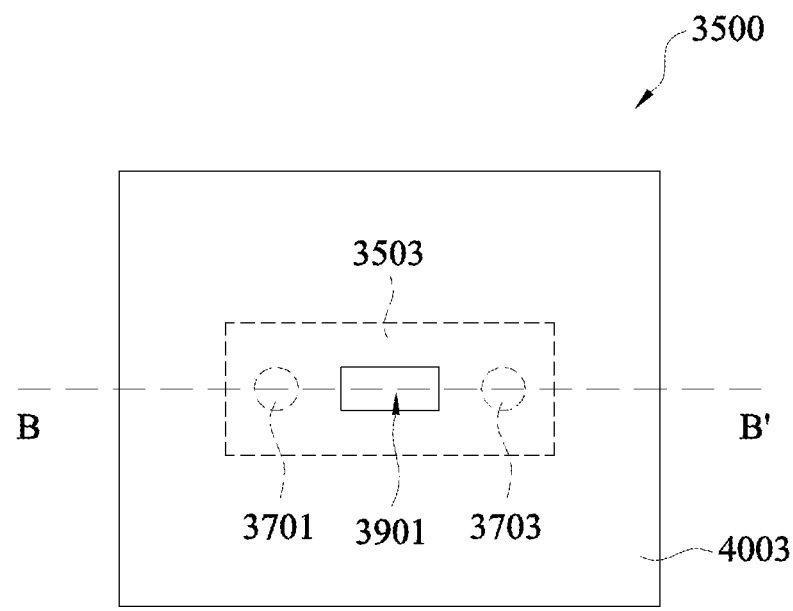
Figure 40B:
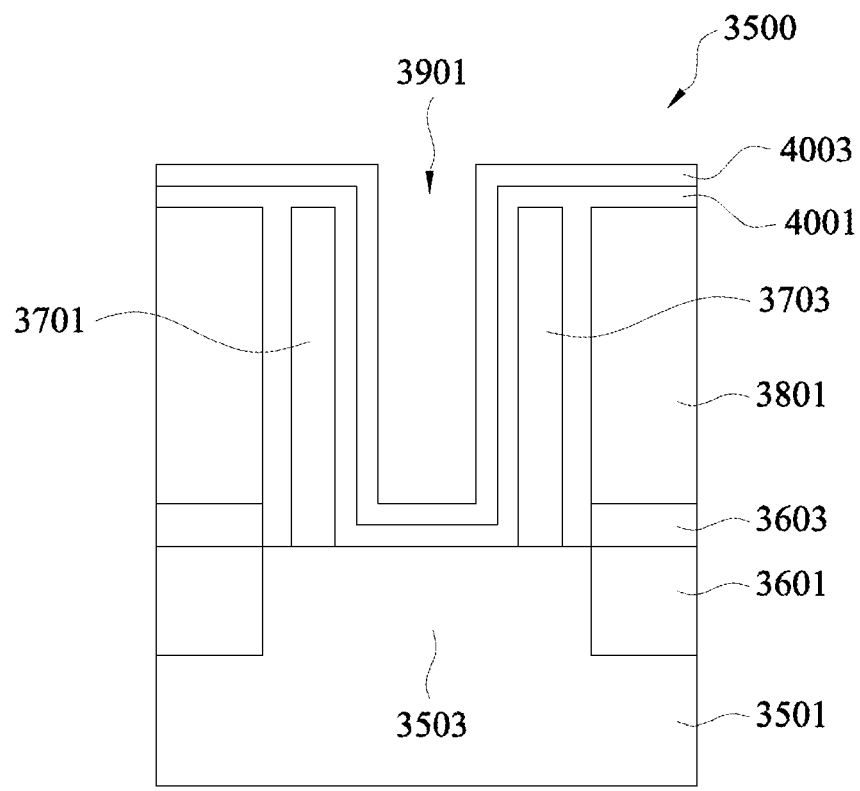

Referring to FIGS. 40A and 40B, a gate stack wrapping the channel (comprising the first nanowire 3701, the second nanowire 3703 and the fin 3503) of the semiconductor device 3500 is formed in the opening 3901. In some embodiments, a gate dielectric layer 4001 is conformally formed in the opening 3901. The gate dielectric layer 4001 covers sidewalls and a bottom of the opening 3901, and exposed surfaces of the first nanowire 3701, the second nanowire 3703 and the fin 3503. In some embodiment, the gate dielectric layer 4001 may be formed using similar materials and methods as the gate dielectric layer 501 (see FIGS. 5A and 5B) and the description is not repeated herein. Subsequently, a work function layer 4003 is conformally formed in the opening 3901 adjacent the gate dielectric layer 4001. In some embodiment, the work function layer 4003 may be formed using similar materials and methods as the work function layer 503 (see FIGS. 5A and 5B) and the description is not repeated herein.

Figure 41A:
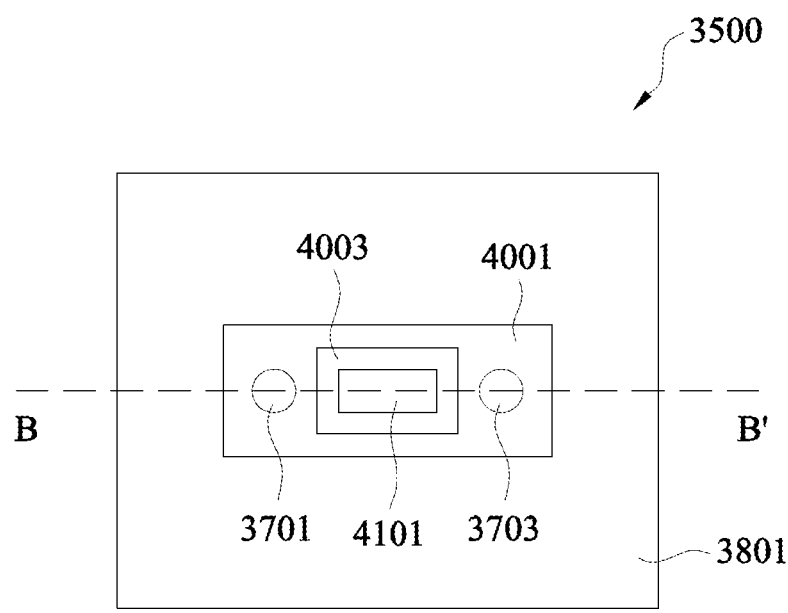
Figure 41B:
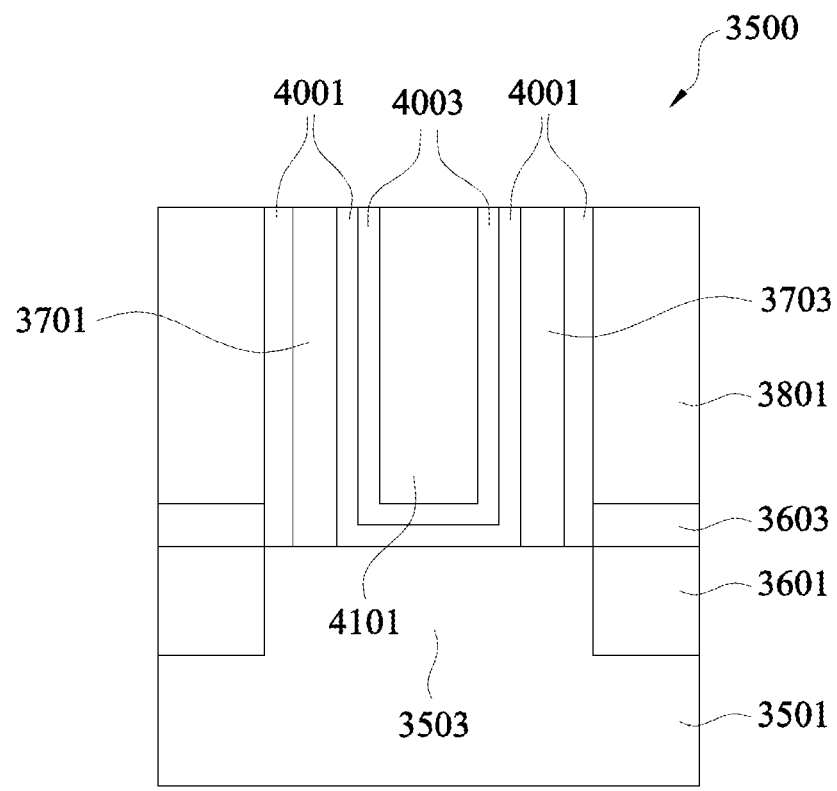

Referring to FIGS. 41A and 41B, a dielectric layer 4101 is formed in the opening 3901. In some embodiments, the dielectric layer 4101 may be formed using similar materials and methods as the dielectric layer 701 (see FIGS. 7A and 7B) and the description is not repeated herein. In some embodiments, the dielectric layer 3801 and the dielectric layer 4101 are formed of a same material. In other embodiments, the dielectric layer 3801 and the dielectric layer 4101 are formed of different materials. Subsequently, portions of the gate dielectric layer 4001, the work function layer 4003 and the dielectric layer 4101 extending over the dielectric layer 3801 may be removed such that top surfaces of the gate dielectric layer 4001, the work function layer 4003 and the dielectric layer 4101 are substantially coplanar with a top surface of the dielectric layer 3801. In some embodiments, excess materials may be removed using, for example, an etching process, a grinding process, a CMP process, and the like.

Figure 42A:
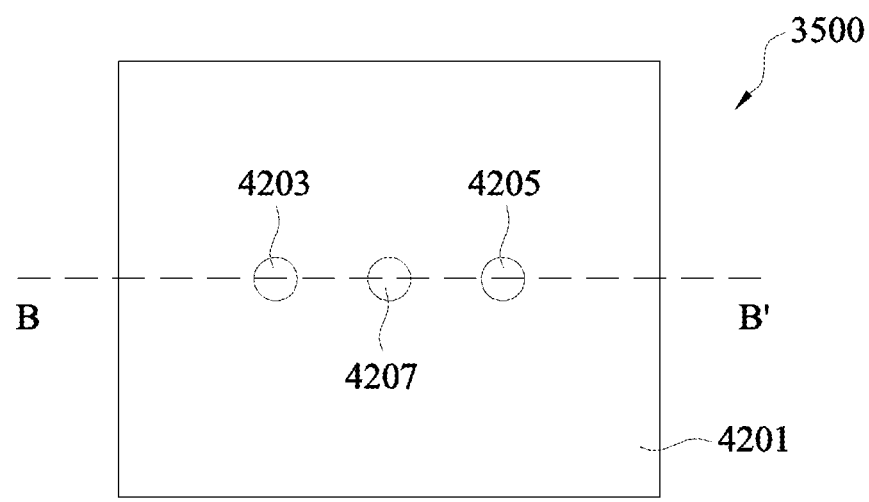
Figure 42B:
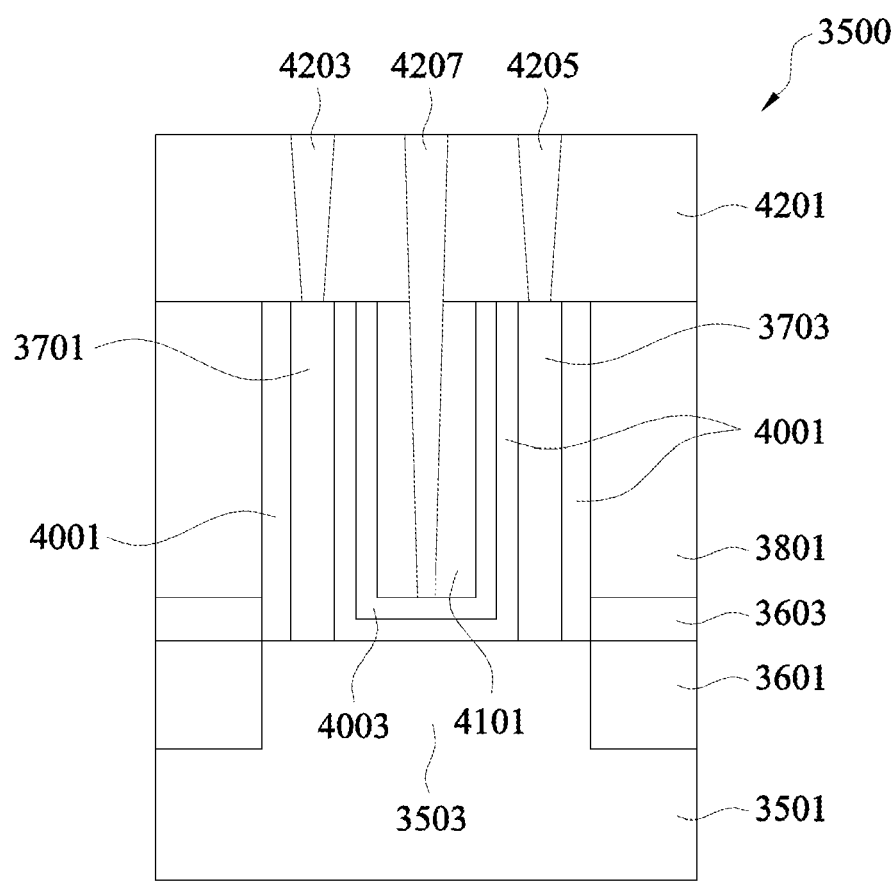

Referring to FIGS. 42A and 42B, an ILD layer 4201 is formed over the dielectric layer 3801. In some embodiments, the ILD layer 4201 may be formed using similar materials and methods as the ILD layer 1201 (see FIGS. 12A and 12B) and the description is not repeated herein. Subsequently, a first contact plug 4203, a second contact plug 4205, and a third contact plug 4207 are formed in the ILD layer 4201 to provide electrical connections to the first nanowire 3701, the second nanowire 3703 and the work function layer 4003, respectively. In some embodiments, the first contact plug 4203, the second contact plug 4205, and the third contact plug 4207 may be formed using similar material and methods as the first contact plug 1301, the second contact plug 1303, and the third contact plug 1305 (see FIGS. 13A and 13B), respectively, and the description is not repeated herein. In the illustrated embodiment, the first contact plug 4203 extends through the ILD layer 4201 and contacts the first nanowire 3701. The second contact plug 4205 extends through the ILD layer 4201 and contacts the second nanowires 3703. The third contact plug 4207 extends through the ILD layer 4201 and contacts the work function layer 4003.

Referring further to FIGS. 42A and 42B, in the illustrated embodiment, the third contact plug 4207 directly contacts the work function layer 4003. In other embodiments, before filling the opening 3901 with the dielectric layer 4101, a gate electrode (not shown) may be formed in the opening 3901. In some embodiments, the gate electrode may be formed using similar materials and methods as the gate electrode 1105 (see FIGS. 11A and 11B) and the description is not repeated herein. In some embodiments, the gate electrode may partially or fully fill the opening 3901.

In some embodiments, further manufacturing steps may be performed on the semiconductor device 3500. For example, metallization layers (not shown) may be formed over the ILD layer 4201. The metallization layers may comprise one or more dielectric layers, and one or more conductive features formed in the one or more dielectric layers. In some embodiments, the metallization layers are in electrical contact with the first contact plug 4203, the second contact plug 4205, and the third contact plug 4207, and electrically interconnect the semiconductor device 3500 to other devices formed on the substrate 3501. In some embodiments, the further manufacturing steps may also include formation of one or more redistribution layers (RDLs) over the metallization layers, formation of under-bump metallizations (UBMs) over the RLDs, and formation of connectors over the UBMs. Subsequently, the substrate 3501 may be singulated into separate dies, which may further undergo various packaging processes.

Figure 43:
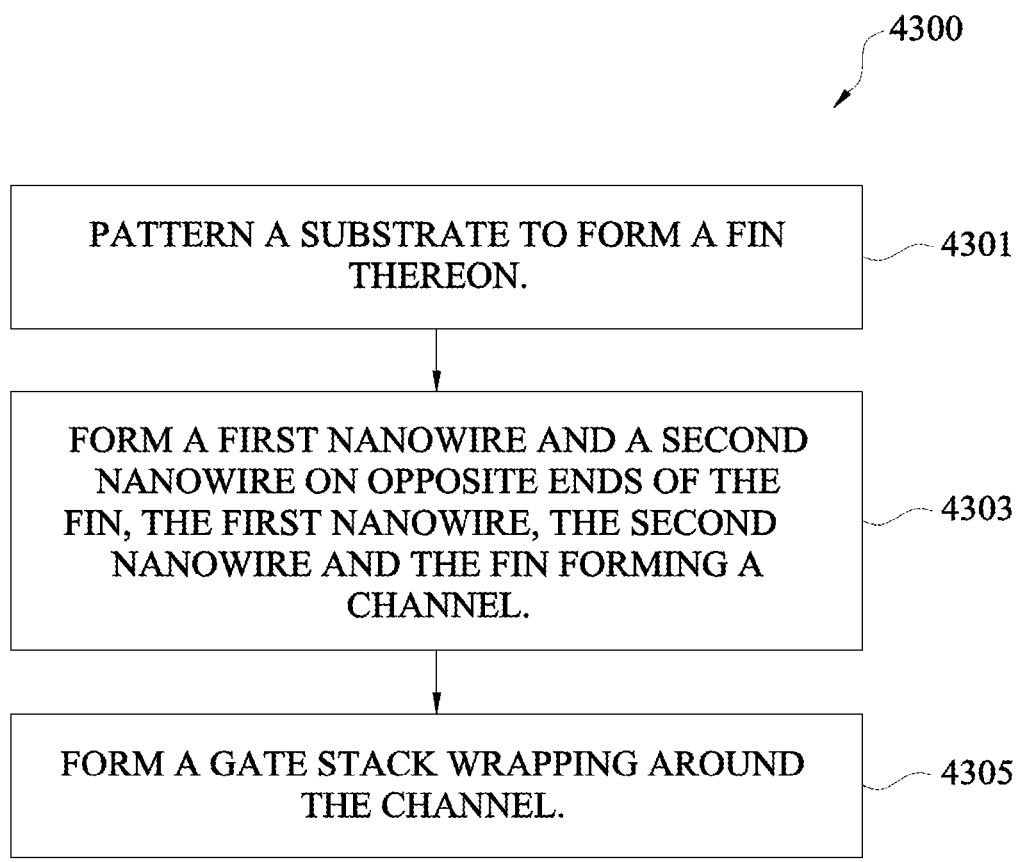
FIG. 43 is a flow diagram illustrating a method of forming a semiconductor device in accordance with some embodiments.

FIG. 43 is a flow diagram illustrating a method 4300 of forming the semiconductor device 3500 in accordance with some embodiments. The method 4300 starts with step 4301, wherein a fin (such as the fin 3503) is formed on a substrate (such as the substrate 3501) as described above with reference to FIGS. 35A and 35B. In step 4303, a first nanowire (such as the first nanowire 3701) and a second nanowire (such as the second nanowire 3703) are formed on opposite ends of the fin as described above with reference to FIGS. 36A-37B. In some embodiments, the first nanowire, the second nanowire and the fin form a channel of the semiconductor device 3500. In step 4305, a gate stack (such as the gate dielectric layer 4001 and the work function layer 4003) is formed wrapping around the first nanowire, the second nanowire and the fin as described above with reference to FIGS. 38A-40B.

According to an embodiment, a semiconductor device includes a substrate having a fin. A first nanowire is disposed on the fin and a second nanowire is disposed on the fin, the second nanowire being laterally separated from the first nanowire. A gate structure extends around the first nanowire and the second nanowire. The gate structure also extends over a top surface of the fin. The first nanowire, the second nanowire, and the fin form a channel of a transistor.

According to another embodiment, a semiconductor device includes a fin extending from a substrate. A first nanowire is on a first end of the fin and extends vertically from an upper surface of the fin. A second nanowire is on a second end of the fin and extends vertically from the upper surface of the fin. At least a portion of the first nanowire, at least a portion of the second nanowire, and at least a portion of the fin form a channel of a transistor.

According to another embodiment, a semiconductor device includes a first leg extending vertically from a substrate. The semiconductor device also includes a second leg extending vertically from the substrate, and a third leg extending horizontally from a top of the first leg to a top of the second leg. The first leg, second leg, and third leg are made of the same material. At least a portion of the first leg, second leg, and third leg, form a channel of a transistor.

According to an embodiment, a semiconductor device includes a substrate, the substrate having a first source/drain feature and a second source/drain feature formed thereon, and a first nanowire on the first source/drain feature, the first nanowire extending vertically from an upper surface of the first source/drain feature. The semiconductor device further includes a second nanowire on the second source/drain feature, the second nanowire extending vertically from an upper surface of the second source/drain feature, and a third nanowire extending from an upper end of the first nanowire to an upper end of the second nanowire, wherein the first nanowire, the second nanowire and the third nanowire form a channel.

According to another embodiment, a semiconductor device includes a fin extending from a substrate, and a first nanowire on a first end of the fin, the first nanowire extending vertically from an upper surface of the fin. The semiconductor device further includes a second nanowire on a second end of the fin, the second nanowire extending vertically from the upper surface of the fin, wherein the first nanowire, the second nanowire and the fin form a channel of a transistor.

According to yet another embodiment, a method of forming a semiconductor device, the method includes forming a first source/drain feature and a second source/drain feature on a substrate, forming a first dielectric layer on the first source/drain feature and the second source/drain feature, and patterning the first dielectric layer to form a first opening and a second opening therein, the first opening exposing the first source/drain feature and the second opening exposing the second source/drain feature. The method further includes epitaxially growing a first nanowire in the first opening and a second nanowire in the second opening, the first nanowire extending vertically from an upper surface of the first source/drain feature and the second nanowire extending vertically from an upper surface of the second source/drain feature, and forming a second dielectric layer on the first dielectric layer and surrounding the first nanowire and the second nanowire. The method further includes patterning the second dielectric layer to form a third opening therein, the third opening exposing at least a portion of the first nanowire and at least a portion of the second nanowire, and forming a third nanowire in the third opening, the third nanowire extending form an upper end of the first nanowire to an upper end of the second nanowire.

According to yet another embodiment, a semiconductor device includes a fin extending from a substrate, and a first nanowire on a first end of the fin, the first nanowire extending vertically from an upper surface of the fin. The semiconductor device further includes a second nanowire on a second end of the fin, the second nanowire extending vertically from the upper surface of the fin, wherein at least a portion of the first nanowire, at least a portion of the second nanowire and the fin form a channel of a transistor.

According to yet another embodiment, a semiconductor device includes a substrate, the substrate having a plurality of recesses, a first source/drain feature interposed between a first pair of adjacent recesses, and a second source/drain feature interposed between a second pair of adjacent recesses. The semiconductor device further includes a first nanowire physically contacting a first upper surface of the first source/drain feature, the first nanowire extending vertically from the first upper surface of the first source/drain feature, a second nanowire physically contacting a second upper surface of the second source/drain feature, the second nanowire extending vertically from the second upper surface of the second source/drain feature, and a third nanowire extending between a first sidewall of the first nanowire and a second sidewall of the second nanowire, wherein the first nanowire, the second nanowire and the third nanowire form a channel.

According to another embodiment, a method includes forming a first fin from a substrate, the substrate having a base portion and a fin portion. A semiconductor material layer is deposited over the first fin, the semiconductor material layer extending down an end of the first fin and over the base portion of the substrate, the semiconductor material layer over the base portion of the substrate corresponding to a source/drain region. A portion of the first fin is exposed from the semiconductor material layer. The first fin under the semiconductor material layer is removed, thereby exposing an underside of the semiconductor material layer. A gate stack is formed wrapping around the semiconductor material layer, the semiconductor material layer being a channel region of a transistor.

According to another embodiment, a method includes forming a first fin from a substrate. The first fin is covered with a channel layer, the channel layer including a semiconductor material, where the channel layer extends over ends of the first fin. The semiconductor material is extended over a portion of the substrate, thereby forming a first source/drain region. A portion of the channel layer is removed to expose a portion of the first fin. The first fin is etched to form a first opening under the channel layer, thereby exposing a bottom surface of the channel layer. An all-around gate stack is formed on a top surface of the channel layer and on the bottom surface of the channel layer.

According to yet another embodiment, a semiconductor device includes a first leg extending vertically from a substrate, a second leg extending vertically from the substrate, and a third leg extending horizontally from a top of the first leg to a top of the second leg. The first leg, second leg, and third leg include a same material, where at least a portion of the first leg, second leg, and third leg form a channel of a transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first fin from a substrate, a base portion of the substrate surrounding the first fin;
    depositing a semiconductor material layer over the first fin, the semiconductor material layer extending down an end of the first fin and over the base portion of the substrate, the semiconductor material layer over the base portion of the substrate corresponding to a source/drain region;
    patterning the semiconductor material layer to expose a portion of the first fin from the semiconductor material layer and form a patterned semiconductor material layer;
    removing the first fin under the patterned semiconductor material layer, thereby exposing an underside of the patterned semiconductor material layer; and
    forming a gate stack wrapping around the patterned semiconductor material layer, the patterned semiconductor material layer being a channel region of a transistor.

2. The method of claim 1, further comprising:
    after patterning the semiconductor material layer, etching a trench in the first fin to separate the first fin into a first semiconductor strip and a second semiconductor strip, a first portion of the patterned semiconductor material layer extending over the first semiconductor strip and a second portion of the patterned semiconductor material layer extending over the second semiconductor strip.

3. The method of claim 1, further comprising:
    forming a first dielectric layer over the first fin; and
    forming an opening in the first dielectric layer exposing the first fin and patterned semiconductor material layer, wherein the gate stack is formed within the opening.

4. The method of claim 3, further comprising:
    forming an interlayer dielectric (ILD) layer over the gate stack and the first dielectric layer;
    forming a first contact plug within the ILD layer, the first contact plug contacting the gate stack; and
    forming a second contact plug within the ILD layer and extending through the first dielectric layer, the second contact plug contacting the source/drain region.

5. The method of claim 1, wherein forming the gate stack comprises:
    forming a gate dielectric layer covering exposed surfaces of the patterned semiconductor material layer;
    forming a work function layer on the gate dielectric layer; and
    forming a gate electrode on the work function layer.

6. The method of claim 2, wherein the first portion of the semiconductor material layer corresponding to the source/drain region is coupled to the second portion of the second semiconductor material layer corresponding to the source/drain region.

7. The method of claim 1, further comprising:
    after patterning the semiconductor material layer to expose a portion of the first fin from the patterned semiconductor material layer, patterning the patterned semiconductor material layer to form the source/drain region on the base portion of the substrate.

8. A method, comprising:
forming a first fin from a substrate;
covering the first fin with a channel layer, the channel layer comprising a semiconductor material, wherein the channel layer extends over ends of the first fin;
extending the semiconductor material over a portion of the substrate, thereby forming a first source/drain region;
removing a portion of the channel layer to expose a portion of the first fin;
etching the first fin to form a first opening under the channel layer, thereby exposing a bottom surface of the channel layer; and
forming an all-around gate stack on a top surface of the channel layer and on the bottom surface of the channel layer.

9. The method of claim 8, further comprising:
prior to etching the first fin, patterning the first fin into a plurality of fins, wherein the first source/drain region extends to each of the plurality of fins.

10. The method of claim 9, wherein each of the plurality of fins has a portion of the channel layer disposed thereon.

11. The method of claim 8, further comprising:
prior to etching the first fin, forming a first dielectric layer over the substrate and first fin; and
patterning the first dielectric layer to form a second opening in the first dielectric layer, the second opening exposing the channel layer, wherein the first dielectric layer remains over the first source/drain region.

12. The method of claim 11, wherein forming the all-around gate stack comprises:
forming a gate dielectric layer on the top surface and bottom surface of the channel layer;
forming a work function layer on the gate dielectric layer;
forming a gate electrode on the work function layer, the gate electrode extending over the first dielectric layer; and
planarizing the gate electrode to level an uppermost surface of the gate electrode to an uppermost surface of the first dielectric layer.

13. The method of claim 11, further comprising:
forming a second dielectric layer over the first dielectric layer and the gate stack;
forming a first contact plug through the second dielectric layer to contact the gate stack; and
forming a second contact plug through the first dielectric layer and second dielectric layer to contact the first source/drain region.

14. The method of claim 13, further comprising:
forming metallization layers over the second dielectric layer, the metallization layers electrically coupling the first contact plug to a device formed in the substrate.

15. A method comprising:
forming a first semiconductor layer over a substrate, the first semiconductor layer having a smaller width than the substrate;
depositing a second semiconductor material layer over the first semiconductor layer, the second semiconductor material layer extending along the sidewalls of the first semiconductor layer and along an upper surface of the substrate;
patterning an upper surface of the second semiconductor material layer to form semiconductor strips over the first semiconductor material layer, a portion of the first semiconductor material layer being exposed between the semiconductor strips;
etching the first semiconductor material layer between the semiconductor strips to remove a portion of the first semiconductor material layer in contact with an underside of the semiconductor strips; and
forming a gate stack wrapping around the semiconductor strips.

16. The method of claim 15, wherein following the etching, end portions of the semiconductor strips comprising the second semiconductor layer remain continuously coupled together.

17. The method of claim 15, forming the gate stack comprises:
forming a gate dielectric layer on a top surface of each of the semiconductor strips, the gate dielectric layer wrapping around sides of each of the semiconductor strips and covering a bottom surface of each of the semiconductor strips;
forming a work function layer covering the gate dielectric layer of each of the semiconductor strips; and
depositing a gate electrode on the work function layer.

18. The method of claim 17, wherein the work function layer for each of the semiconductor strips is separated, wherein the gate electrode bridges each of the work function layers of the semiconductor strips.

19. The method of claim 15, further comprising:
depositing an interlayer dielectric (ILD) layer over the gate stack;
forming a first contact plug within the ILD layer, the first contact plug contacting the gate stack; and
forming a second contact plug within the ILD layer, the second contact plug extending to the second semiconductor material layer along the upper surface of the substrate.

20. The method of claim 15, wherein the etching comprises:
forming a dielectric layer over the semiconductor strips;
patterning the dielectric layer to form an opening exposing an upper surface of each of the semiconductor strips, the dielectric layer covering a first portion of the second material layer extending along the upper surface of the substrate; and
etching a second portion of the first material layer between each of the semiconductor strips.

\* \* \* \* \*